(12) United States Patent
Kishi et al.

(10) Patent No.: US 9,678,179 B2
(45) Date of Patent: Jun. 13, 2017

(54) TESTER FOR TESTING MAGNETIC MEMORY

(71) Applicants: Tatsuya Kishi, Seongnam-si (KR); Sumio Ikegawa, Seoul (KR)

(72) Inventors: Tatsuya Kishi, Seongnam-si (KR); Sumio Ikegawa, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 328 days.

(21) Appl. No.: 14/478,925

(22) Filed: Sep. 5, 2014

(65) Prior Publication Data

US 2015/0260804 A1 Sep. 17, 2015

Related U.S. Application Data

(60) Provisional application No. 61/952,782, filed on Mar. 13, 2014.

(51) Int. Cl.
| | |
|---|---|
| G01B 7/14 | (2006.01) |
| G01R 33/12 | (2006.01) |
| G11C 29/56 | (2006.01) |
| G11C 11/16 | (2006.01) |
| G11C 29/50 | (2006.01) |

(52) U.S. Cl.
CPC .... G01R 33/1207 (2013.01); G11C 29/56016 (2013.01); G11C 11/16 (2013.01); G11C 2029/5002 (2013.01); G11C 2029/5602 (2013.01)

(58) Field of Classification Search
CPC .......... G01D 5/145; G01D 5/147; G01B 7/30; G01B 7/003; G01R 33/1207; G01R 33/09; G01R 33/093; G01R 33/02; G01R 33/18; G11C 11/16; G11C 11/1673; G11C 29/08; G11C 29/56016; G11B 5/455; G11B 5/3967
USPC ........ 324/207.2–207.21, 210, 211, 213, 252, 324/228, 262; 335/284–285, 302
See application file for complete search history.

(56) References Cited

U.S. PATENT DOCUMENTS

| | | | |
|---|---|---|---|
| 6,950,334 B2 | 9/2005 | Shimizu et al. | |
| 7,376,003 B2* | 5/2008 | Iwata | G11C 11/16 365/157 |
| 8,553,452 B2* | 10/2013 | Zhou | G11C 11/165 257/200 |
| 9,348,000 B1* | 5/2016 | Pressesky | G01R 33/0325 |

(Continued)

FOREIGN PATENT DOCUMENTS

| | | |
|---|---|---|
| JP | 03180756 A | 8/1991 |
| JP | 04334077 A | 11/1992 |

(Continued)

*Primary Examiner* — Thang Le
(74) *Attorney, Agent, or Firm* — Holtz, Holtz & Volek PC

(57) ABSTRACT

According to one embodiment, a tester includes a magnetic shield portion having a space which is shielded from an external magnetic field, a controller generating a test signal for testing a magnetic memory having a magnetoresistive element provided in the space, an interface portion in the space, the interface portion which functions as an interface between the controller and the magnetic memory, and a magnetic field generating portion in the space, the magnetic field generating portion generating a test magnetic field while the magnetic memory is tested by the test signal.

21 Claims, 20 Drawing Sheets

(56) References Cited

U.S. PATENT DOCUMENTS

| | | | |
|---|---|---|---|
| 2005/0111253 A1 | 5/2005 | Park et al. | |
| 2013/0294144 A1* | 11/2013 | Wang | G11C 29/50008 365/148 |
| 2013/0301335 A1 | 11/2013 | Ong | |
| 2014/0070800 A1* | 3/2014 | Cho | G11C 29/56016 324/228 |
| 2014/0139209 A1* | 5/2014 | Lee | G01R 33/02 324/211 |
| 2014/0254251 A1* | 9/2014 | Lee | G11C 29/00 365/158 |

FOREIGN PATENT DOCUMENTS

| | | |
|---|---|---|
| JP | 2003069111 A | 3/2003 |
| JP | 2003338199 A | 11/2003 |
| JP | 4168438 B2 | 10/2008 |

* cited by examiner

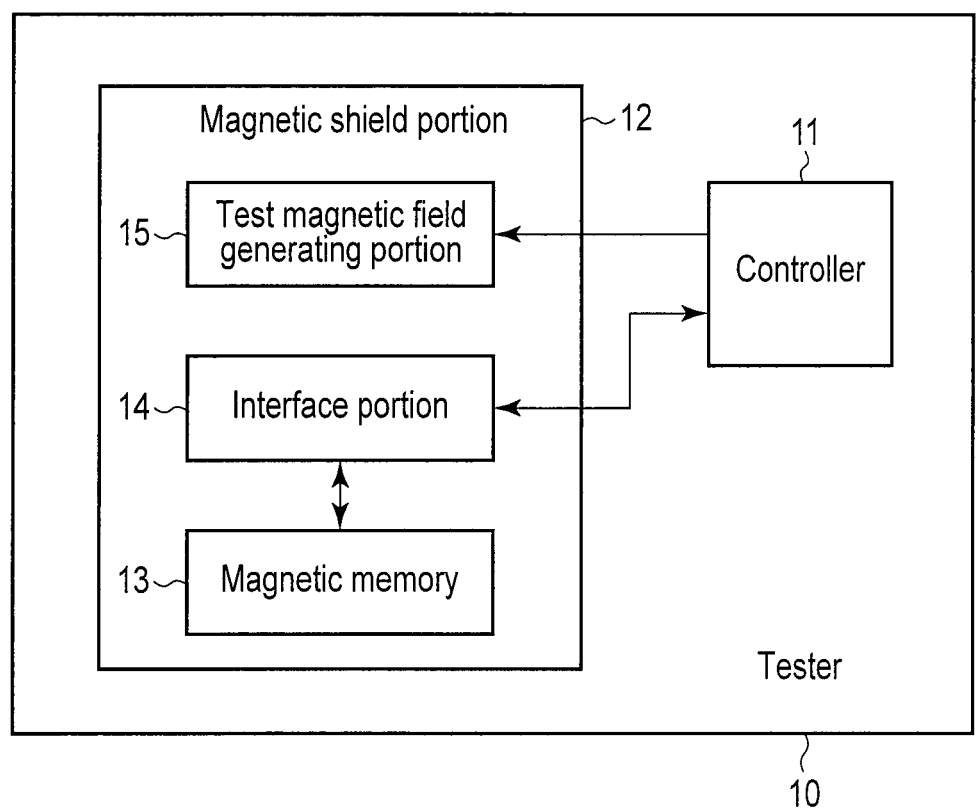
F I G. 1

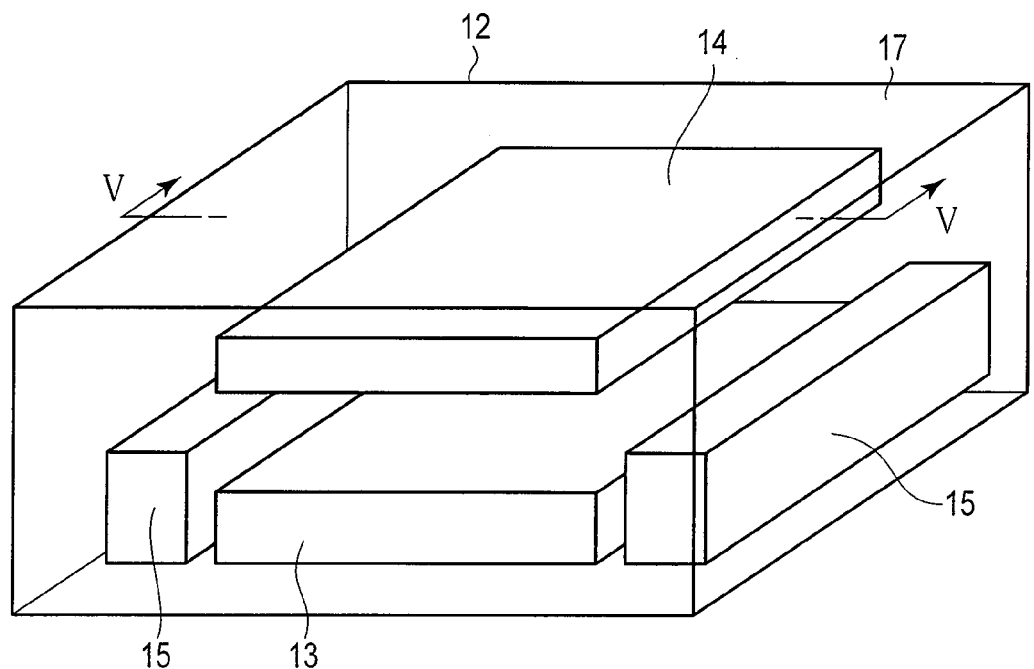
F I G. 4
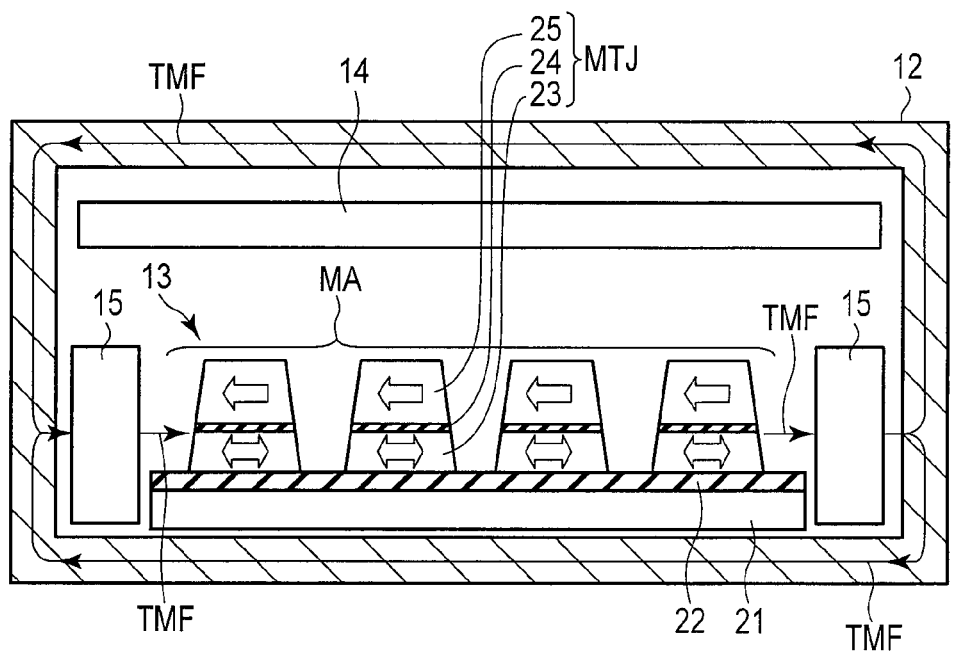
F I G. 5

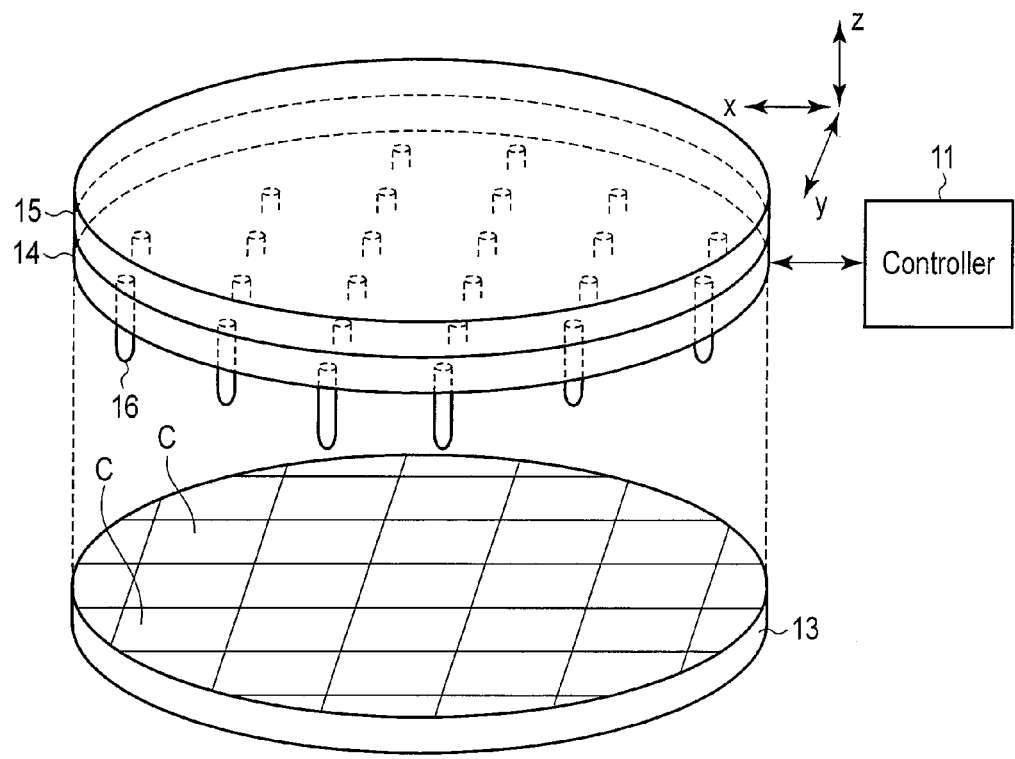
F I G. 6
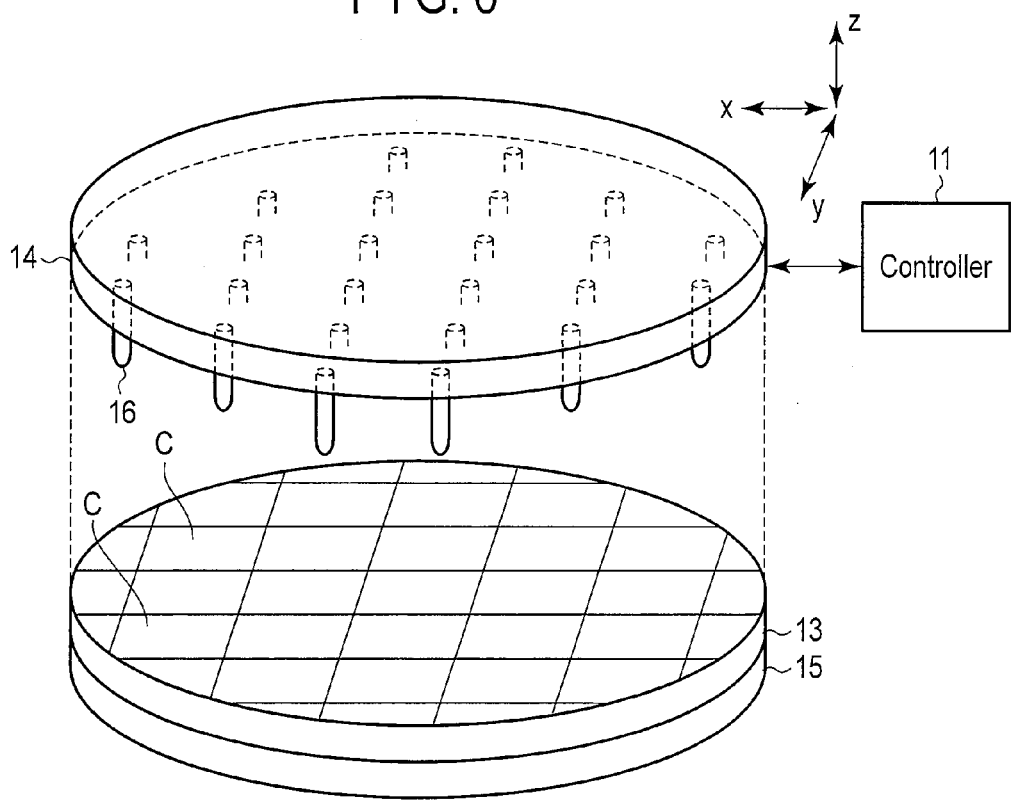
F I G. 7

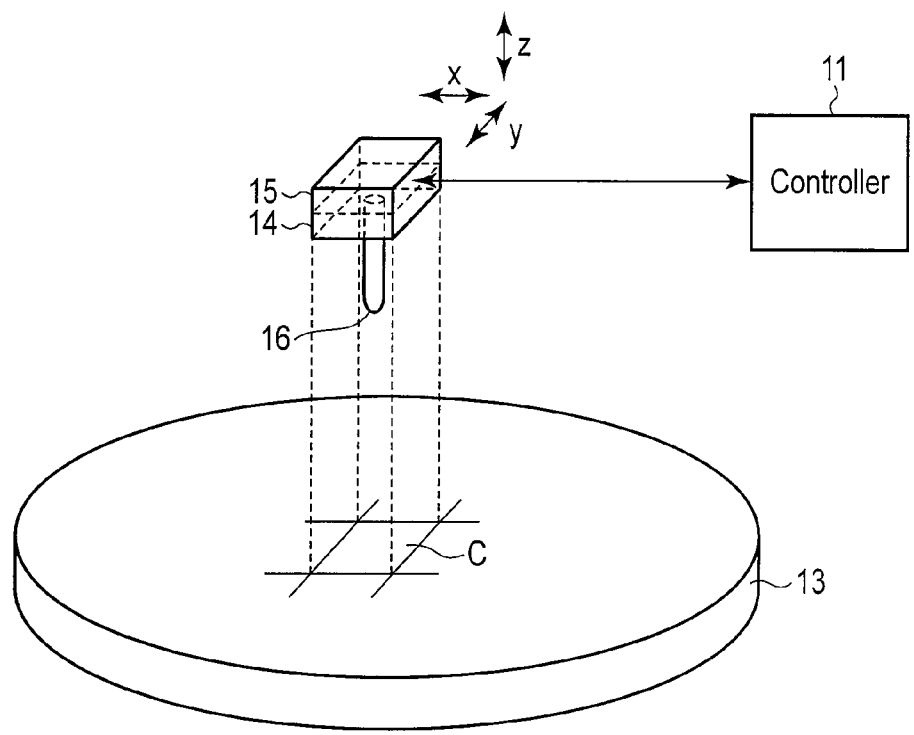
F I G. 12
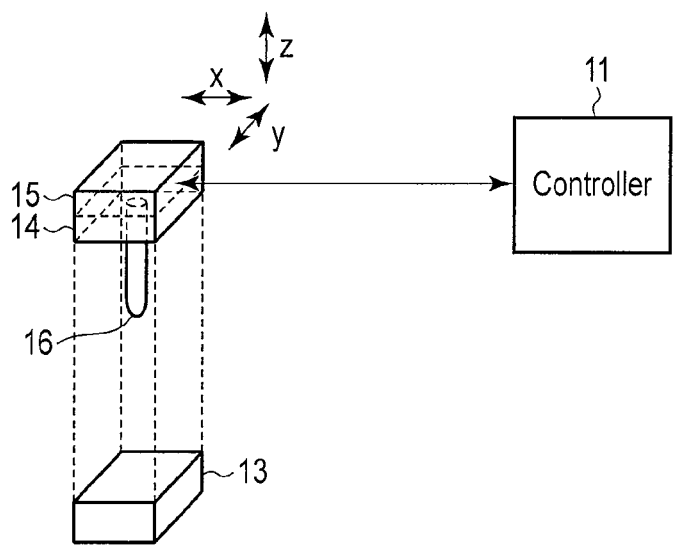
F I G. 13

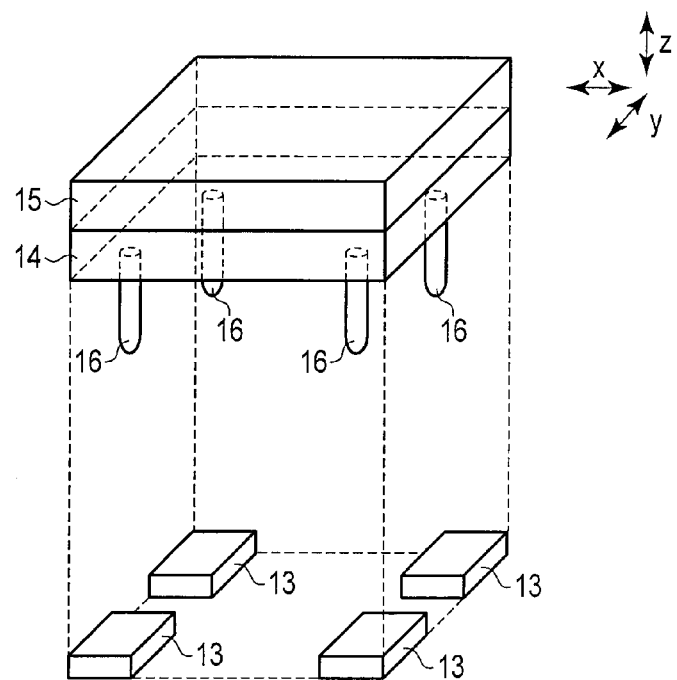
F I G. 14
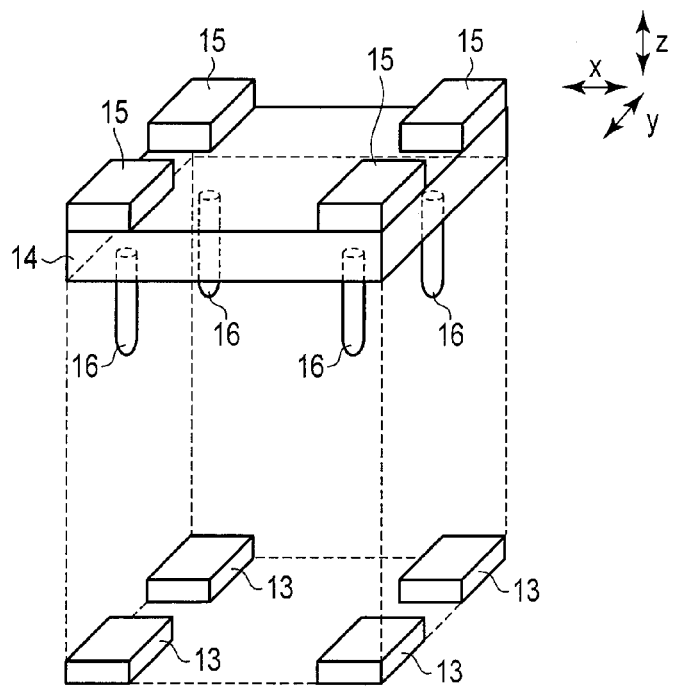
F I G. 15

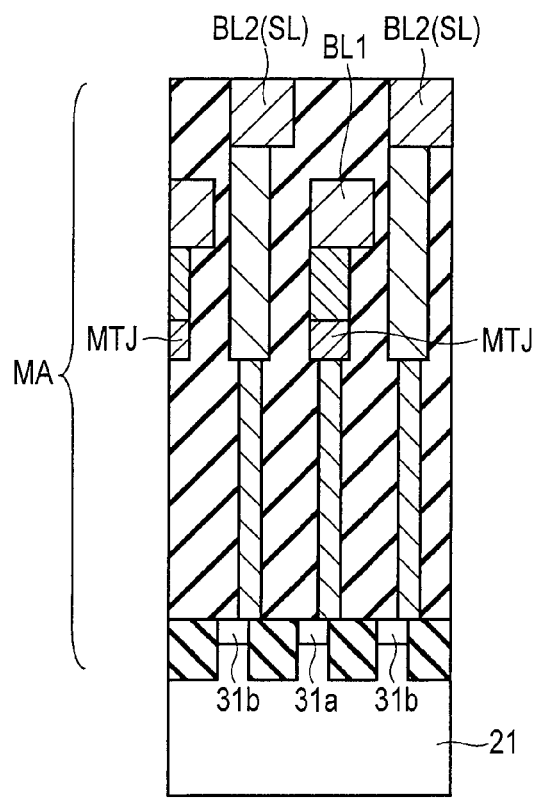 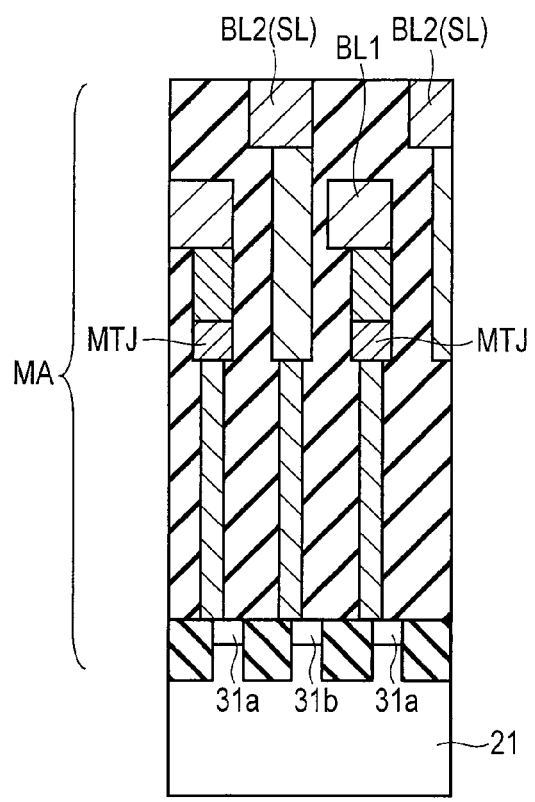
F I G. 18　　　　　F I G. 19

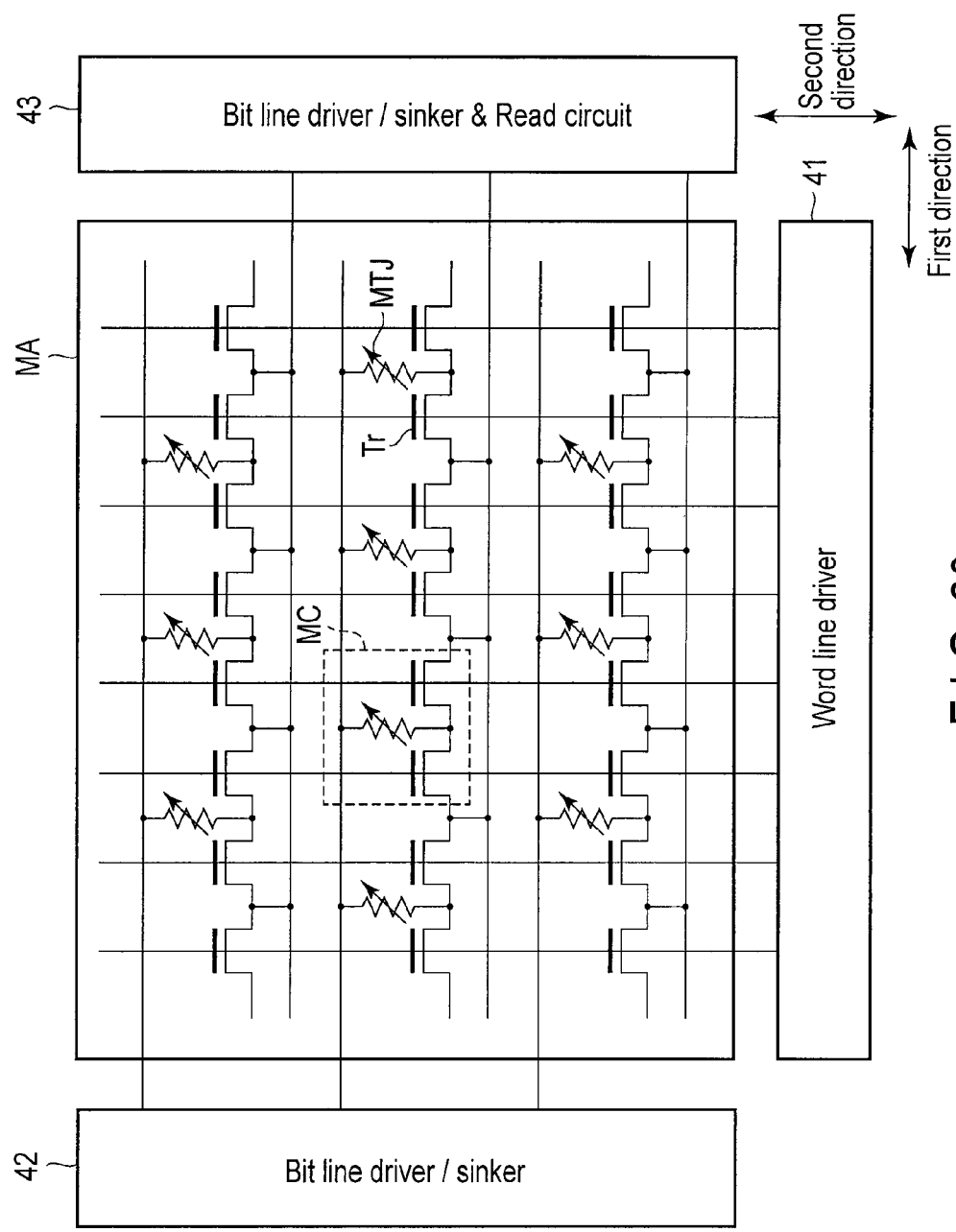
F I G. 20

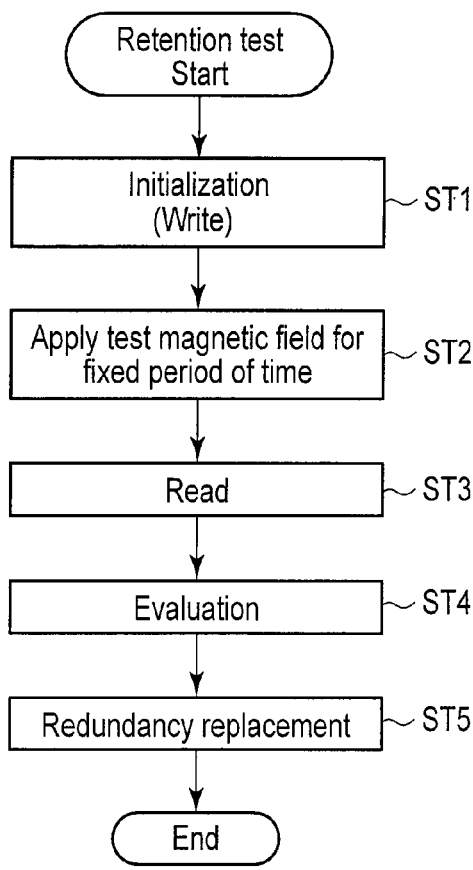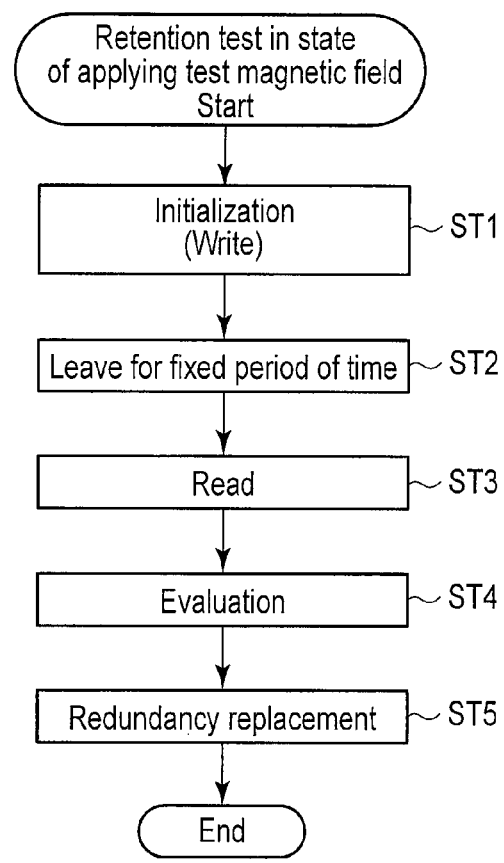
F I G. 21A  F I G. 21B

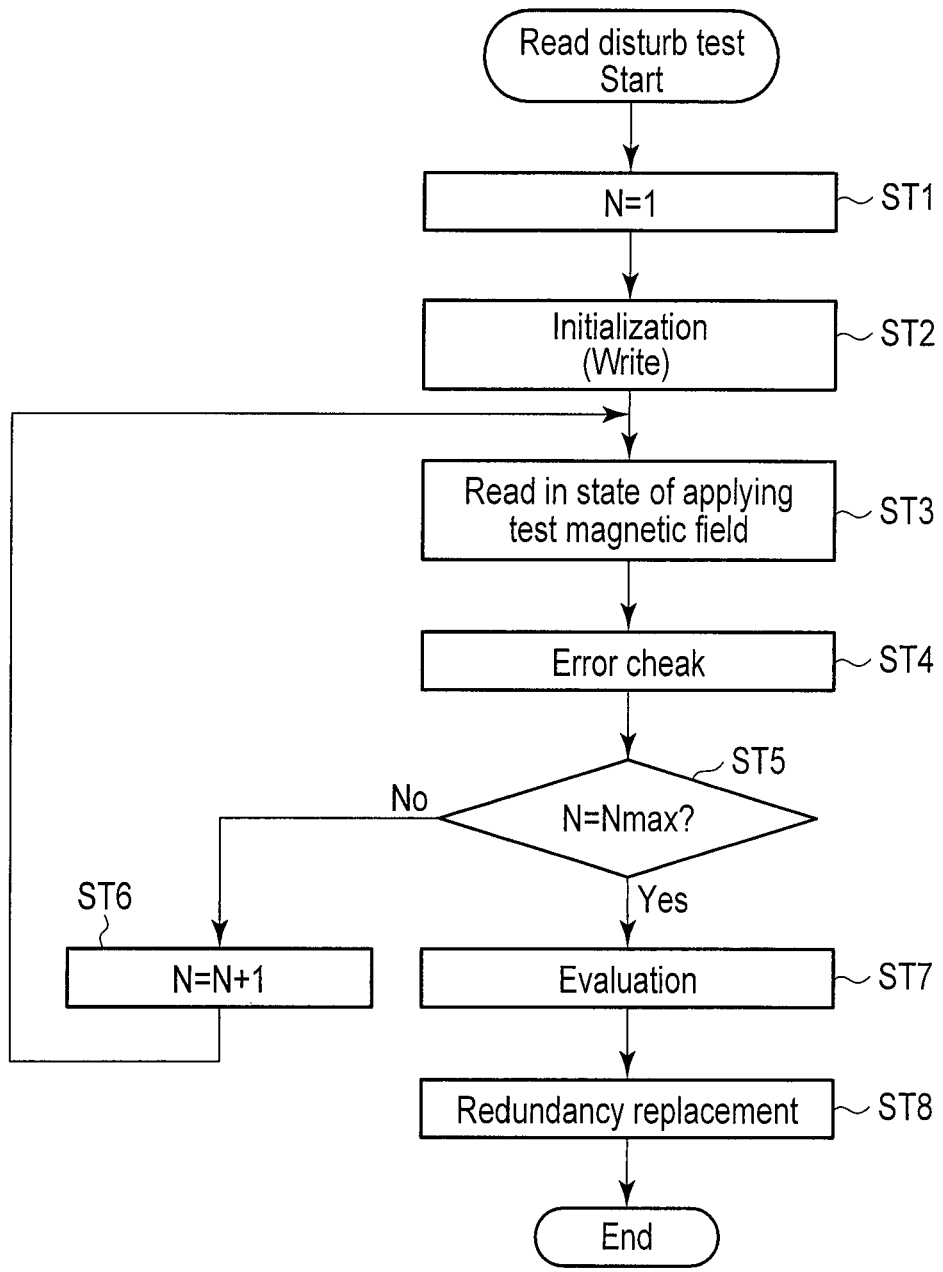
F I G. 22A

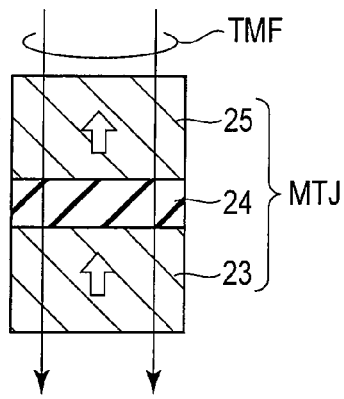 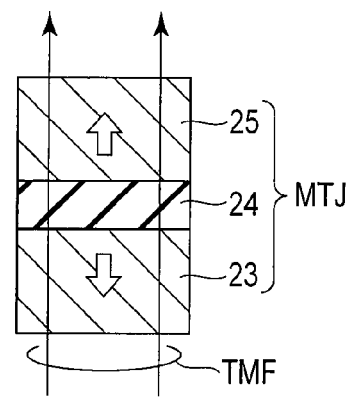
FIG. 24A  FIG. 24B
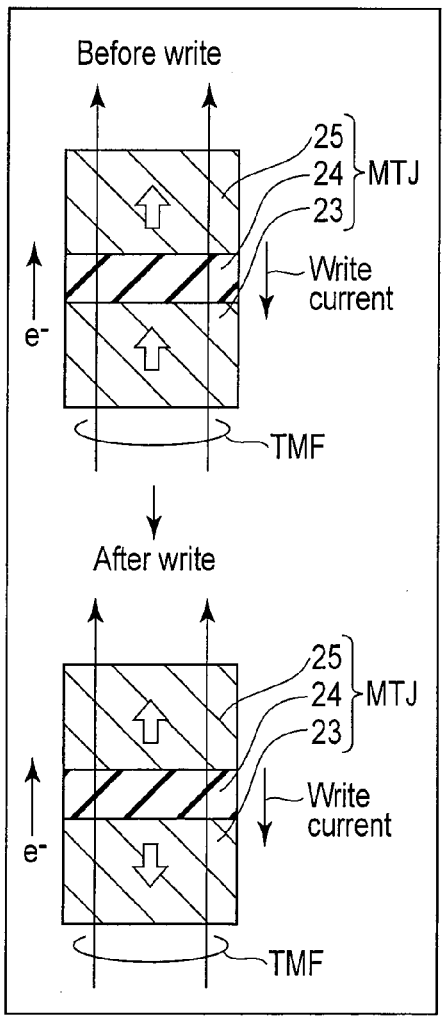 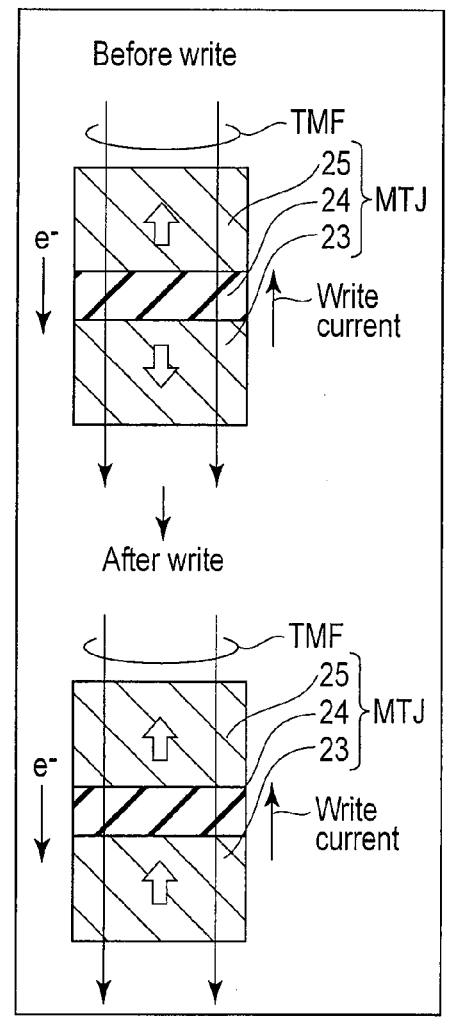
FIG. 25A  FIG. 25B

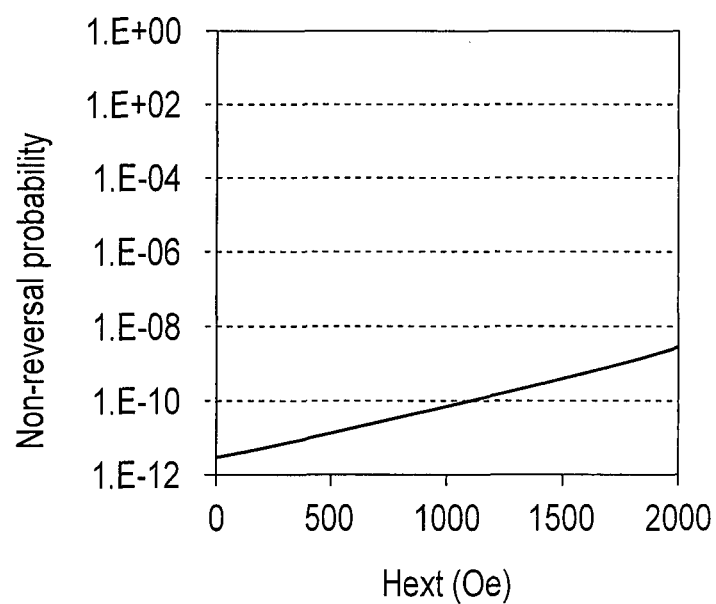
F I G. 28

TESTER FOR TESTING MAGNETIC MEMORY

CROSS-REFERENCE TO RELATED APPLICATIONS

This application claims the benefit of U.S. Provisional Application No. 61/952,782, filed Mar. 13, 2014, the entire contents of which are incorporated herein by reference.

FIELD

Embodiments described herein relate generally to a tester for testing a magnetic memory.

BACKGROUND

In a magnetic memory including a magnetoresistive element such as a spin-transfer-torque magnetic random access memory (STT-MRAM), current required for magnetization inversion of a magnetoresistive element is defined by current density. That is, such a magnetic memory has a scalability that the current required for magnetization inversion decreases in accordance with reduction in size of the magnetoresistive element. Such a magnetic memory is one of the strong candidates for a next generation memory.

On the other hand, in order to commercialize such a magnetic memory including a magnetoresistive element, as done for a conventional semiconductor memory, a test is necessary to detect a fail bit which does not satisfy requirements and to replace the detected fail bit with a pass bit which satisfies the requirements by using, for example, a redundancy technique. However, a proper test method for such a magnetic memory has not been verified to this date.

BRIEF DESCRIPTION OF THE DRAWINGS

FIG. 1 is a block diagram showing a test of a magnetic memory.

FIG. 4 is a perspective view showing another relationship between the magnetic memory, interface portion, and test magnetic field generating portion.

FIG. 5 is a cross-sectional view taken along line V-V in FIG. 4.

FIGS. 6 to 15 are perspective views showing examples of the magnetic memory, interface portion, and test magnetic field generating portion.

FIG. 18 is a cross-sectional view taken along line XVIII-XVIII in FIG. 16.

FIG. 19 is a cross-sectional view taken along line XIX-XIX in FIG. 16.

FIG. 20 is a view showing an equivalent circuit of the memory cell array area of FIGS. 16 to 19.

FIGS. 21A and 21B are flowcharts of retention test examples.

FIGS. 22A and 22B are flowcharts of read disturb test examples.

FIGS. 24A and 24B are cross-sectional views showing test magnetic fields in the retention test and the read disturb test.

FIGS. 25A and 25B are cross-sectional views showing test magnetic fields in the WER test.

FIG. 28 is a view showing a relationship between the test magnetic field and non-reversal probability.

DETAILED DESCRIPTION

Figure 2:
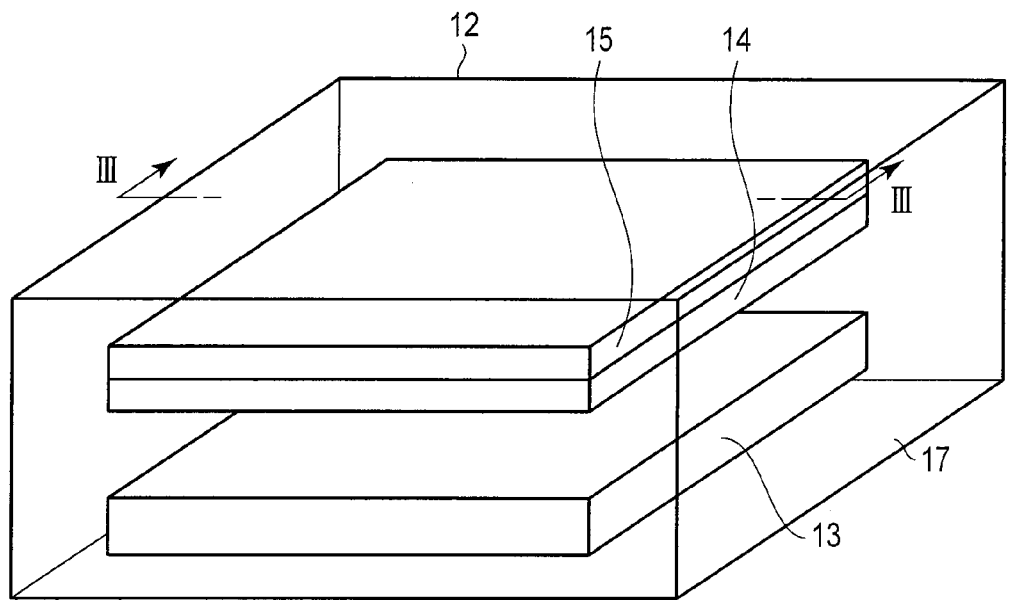
FIG. 2 is a perspective view showing a relationship between the magnetic memory, interface portion, and test magnetic field generating portion.

In general, according to one embodiment, a tester comprises: a magnetic shield portion having a space which is shielded from an external magnetic field; a controller generating a test signal for testing a magnetic memory having a magnetoresistive element provided in the space; an interface portion in the space, the interface portion which functions as an interface between the controller and the magnetic memory; and a magnetic field generating portion in the space, the magnetic field generating portion generating a test magnetic field while the magnetic memory is tested by the test signal.

[Test Variations]

Now, explained are examples of tests necessary for proving that a magnetic memory is fully functional.

(1) Retention Test

Retention here refers to an index which indicates continuous data storable time of a non-volatile memory such as a magnetic memory. A probability that data is properly retained at t s after writing (that is, non-reversal probability) is $P_{NR}(t)$, and this is given by the following equations.

$$P_{NR}(t) = 1 - P_R(t) = 1 - \frac{r_1}{r_1 + r_2}\{1 - \exp[-(r_1 + r_2)t]\} \quad (1)$$

$$r_1 = f_0 \exp\left[-\Delta E\left(1 - \frac{H_{ext}}{H_k}\right)^2\right], r_2 = f_0 \exp\left[-\Delta E\left(1 + \frac{H_{ext}}{H_k}\right)^2\right]$$

Here, $P_R(t)$ is the probability that data is reversed at t s after writing (that is, reversal probability), and $P_{NR}(t)=1-P_R(t)$.

The megnetoresistive element which stores the data includes a storage layer having variable magnetization, a reference layer having invariable magnetization, and a tunnel barrier layer inserted between the storage layer and the reference layer. Furthermore, $\Delta E$ is the energy barrier in the storage layer, and $H_k$ is the anisotropy magnetic field. $H_{ext}$ is the external magnetic field which is directed to be parallel with the magnetization direction of the storage layer and the reference layer.

Given that $\Delta E=80$, $H_{ext}=0$, and $H_k=5000$ Oe at room temperature, the retention reaches an exceptionally long time, namely, $1\times10^{16}$ s. Considering that this value is a median in a 4 gigabits memory, the retention time of a worst bit when the data is reversed at the earliest reaches $4\times10^9$ s, that is, approximately 131 years. Here, the worst bit is a value given when the variation of $\Delta E$ is 3%. Taking such a long time for a retention test is not practical.

(2) Read Disturb Test

Read disturb refers to a phenomenon in which magnetization reversal occurs in a storage layer due to read current.

Usually, the read current is set to a value fully smaller than write current. However, when the read current is too small, there occurs some problems that a read time by a sense amplifier takes too long, and data reading by the sense amplifier cannot be performed at all, and the like.

Therefore, reducing the read current is performed under certain restriction and there is always a lower limit for reducing the read current. This means that, when the read current is supplied in the read time, spin torque occurs, albeit weak, in the magnetoresistive element. Therefore, a data reversal (erroneous writing) occurs in a certain probability $P_{RD}$ in the read time. This is why the read disturb occurs.

The probability of the occurrence of the read disturb $P_{RD}$ can be given by the following equation.

$$P_{RD} = 1 - \exp\left[-\frac{t_{read}}{\tau_0}\exp\left[-\Delta'\left(1 - \frac{H_{ext}}{H_k}\right)^2\left(1 - \frac{I_{read}}{I_{c0}}\right)^2\right]\right] \quad (2)$$

Here, the megnetoresistive element which stores the data includes a storage layer having variable magnetization, a reference layer having invariable magnetization, and a tunnel barrier layer inserted between the storage layer and the reference layer.

Furthermore, $I_{read}$ is the read current, $t_{read}$ is the time for which the read current is supplied, $\Delta'$ is a value having a strong correlation with $\Delta E$, which is the energy barrier of the storage layer, $I_{c0}$ is a value based on cell size, and $H_k$ is the anisotropy magnetic field. $H_{ext}$ is the external magnetic field which is directed to be parallel with the magnetization direction of the storage layer and the reference layer.

From the above equation, given that $\Delta'=80$, $I_{read}=10$ μA, $t_{read}=10$ ns, $\tau_0=10^{-9}$ s, and $H_{ext}=0$, the probability of the occurrence of the read disturb $P_{RD}$ becomes exceptionally rare, namely, $1.0\times10^{-11}$ or less.

In a mass-storage memory, this value corresponds to a median in interbit variations. That is, the probability of the occurrence of the read disturb $P_{RD}$ will be larger in the worst bit. For example, when $\Delta'$ has 10% variations, the probability of the occurrence of the read disturb $P_{RD}$ of the worst bit comes $0.8\times10^{-6}$ which is approximately a ten thousand times larger than the above median value.

However, the probability of the occurrence of the read disturb $P_{RD}$ is of the order of $10^{-7}$ which means that reads must be repeated for $10^7$ times or more for verification. That is, given that a period of an operation clock of the magnetic memory is 50 ns, a test time of $0.5\times10^{-2}$ s is required for verification of a read disturb of one bit of the magnetic memory. Therefore, $2.0\times10^7$ s, that is, approximately 231 hours are required for a test of a 4 gigabits memory. Taking such a long time for a read disturb test is not practical.

(3) Write Error Rate (WER) Test

The term "write error" here means a phenomenon in which a probability of accurate data writing cannot be 1 due to thermal fluctuation. The write error rate $R_{WT}$ is given by the following equation.

$$P_{WT} = 1 - \exp\left[-\frac{(t_{WT} - t_0)}{\tau_0}\exp\left[-\Delta''\left(1 - \frac{H_{ext}}{H_k}\right)\left(1 - \frac{I_{write}}{I_{c0}}\right)^2\right]\right] \quad (3)$$

Here, the megnetoresistive element which stores the data includes a storage layer having variable magnetization, a reference layer having invariable magnetization, and a tunnel barrier layer inserted between the storage layer and the reference layer.

Furthermore, $I_{write}$ is the write current, $t_{WT}$ is the time the write current is supplied, $t_0$ is the delay time, $\Delta''$ is a value having a strong correlation with $\Delta E$, which is the energy barrier of the storage layer, $I_{c0}$ is a value based on cell size, and $H_k$ is the anisotropy magnetic field. $H_{ext}$ is the external magnetic field which is directed to be parallel with the magnetization direction of the storage layer and the reference layer.

Derived from the above, given that $\Delta''=90$, $t_{WT}=30$ ns, $t_0=10$ ns, $I_{write}=30$ μA, and $H_{ext}=0$, the write error rate $R_{WT}$ is exceptionally small, namely, $2.8\times10^{-11}$ or less.

Considering the above, at least $10^{12}$ writes must be performed to test the WER of the magnetic memory, for example. To carry out the writes of such a large number, several years are necessary. That is, as in the above two cases, taking such a long time for a WER test is not practical.

(4) Consideration

As can be understood from the above, tests mentioned above must be conducted for proving that a magnetic memory is fully functional before commercialization to evaluate a property of the magnetic memory. However, such tests are not practical since they require an exceptionally long time and therefore, a test method solving this test time problem must be established.

Here, what to be noted as a potential key to solve this problem is an external magnetic field $H_{ext}$. From the above-described equations (1), (2), and (3), each of $P_{NR}(t)$, $P_{RD}$, and $P_{WT}$ depends on the external magnetic field $H_{ext}$.

In the following embodiments, a so-called magnetic field acceleration test performed while the external magnetic field $H_{ext}$ is being applied to the magnetic memory including the magnetoresistive element.

Here, in the following description, the external magnetic field $H_{ext}$ is referred to as "test magnetic field", and a simple use of a term "external magnetic field" refers to an external magnetic field on earth which is irrelevant to the test.

[Tester]

FIG. 1 shows an example of a tester for testing a magnetic memory.

A tester 10 includes a controller 11 and a magnetic shield portion 12. In the magnetic shield portion 12, a space which is shielded from an external magnetic field is provided.

Here, in the following description, the magnetic shield portion 12 may be omitted. That is, the magnetic shield portion 12 should preferably be installed in the tester 10 to conduct a detailed test to detect a critical error, but the magnetic shield portion 12 may be omitted from the tester 10 to conduct, for example, a rough test to detect general errors those are not a critical one.

A magnetic memory 13, interface portion 14, and test magnetic field generating portion 15 are disposed within, for example, the space in the magnetic shield portion 12.

The magnetic memory 13 is, for example, a magnetic random access memory and includes a magnetoresistive element. The controller 11 generates test signals used for testing the magnetic memory 13. The interface portion 14 functions as an interface between the controller 11 and the magnetic memory 13. While the magnetic memory 13 is being tested by the test signals from the controller 11, the test magnetic field generating portion 15 generates a test magnetic field. The test magnetic field is directed to the direction of angle 9 with respect to the magnetization direction of the magnetoresistive element to accelerate the test of the magnetic memory. Here, a range of $0°\leq\theta\leq90°$ is maintained. The megnetoresistive element includes a storage layer having variable magnetization, a reference layer having invariable magnetization, and a tunnel barrier layer inserted between the storage layer and the reference layer. The magnetization direction of the magnetoresistive element used herein refers to the magnetization direction of the storage layer and the reference layer.

Furthermore, the test magnetic field should preferably be directed to be parallel to the magnetization direction of the magnetoresistive element ($\theta=0$). This is because the influence by the test magnetic field becomes largest when $\theta=0$, that is, the test time is minimized.

Furthermore, the test magnetic field is used for accelerating the test of the magnetic memory and is not used for reversing the magnetization direction of the storage layer of the magnetoresistive element. Thus, the strength of the test magnetic field is less than a reverse magnetic field which reverses the magnetization direction of the storage layer of the magnetoresistive element.

Figure 3:
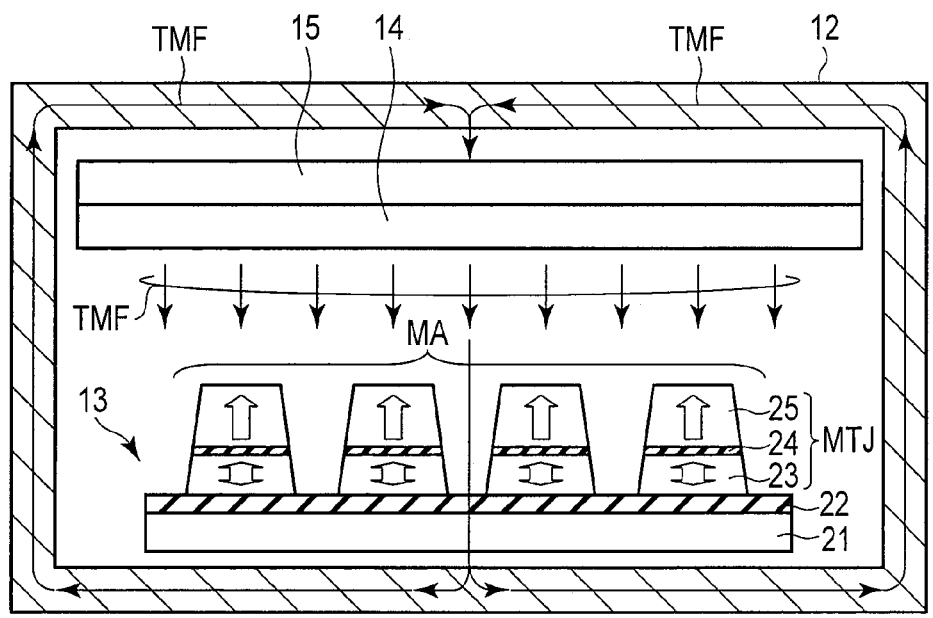
FIG. 3 is a cross-sectional view taken along line in FIG. 2.

FIGS. 2 to 5 show relationships between the magnetic memory, interface portion, and test magnetic field generating portion. FIG. 3 is a cross-sectional view taken along line III-III in FIG. 2. FIG. 5 is a cross-sectional view taken along line V-V in FIG. 4.

The magnetic memory 13, interface portion 14, and test magnetic field generating portion 15 are disposed within the magnetic shield portion 12.

The magnetic memory 13 includes a semiconductor substrate 21 and a memory cell array area MA on an insulating layer 22 on the semiconductor substrate 21.

The memory cell array area MA includes a plurality of magnetoresistive elements MTJ arranged in an array. Each of the plurality of magnetoresistive elements MTJ includes a storage layer 23 having variable magnetization, a reference layer 25 having invariable magnetization, and a tunnel barrier 24 interposed therebetween.

In this example, the reference layer 25 is disposed on the storage layer 23; however, the storage layer 23 may be disposed on the reference layer 25 instead.

In the example shown in FIGS. 2 and 3, the storage layer 23 and the reference layer 25 have perpendicular magnetization which is perpendicular to the surface of the semiconductor substrate 21. That is, the magnetoresistive element MTJ shown in FIGS. 2 and 3 is of a perpendicular magnetization type. In contrast, in the example shown in FIGS. 4 and 5, the storage layer 23 and the reference layer 25 have in-plane magnetization which is parallel with the surface of the semiconductor substrate 21. That is, the magnetoresistive element MTJ shown in FIGS. 4 and 5 is of an in-plane magnetization type.

The interface portion 14 is in electrically contact with the magnetic memory 13, and thus, is disposed on the upper portion of the magnetic memory 13, for example. As will be discussed below, the interface portion 14 includes, for example, a probe card.

The test magnetic field generating portion 15 generates a test magnetic field TMF which accelerates the test for the magnetic memory 13. The test magnetic field generating portion 15 includes, for example, a permanent magnet or an electromagnet. If the test magnetic field generating portion 15 includes a permanent magnet, manufacturing costs for a tester can be reduced. Or, if the test magnetic field generating portion 15 includes an electromagnet, the generation of the test magnetic field can be controlled by a controller, and thus, the accuracy and efficacy of the test can be improved.

The test magnetic field generating portion 15 may be secured or disposed movably. Furthermore, in the example of FIG. 3, the test magnetic field generating portion 15 may be secured on the interface portion 14, or may be separated from the interface portion 14.

As shown in FIGS. 2 and 3, when the plurality of magnetoresistive elements MTJ are of the perpendicular magnetization type, the test magnetic field generating portion 15 should preferably be disposed above (or below) the memory cell array area MA. For example, the test magnetic field generating portion 15 is disposed in a direction of the lamination of the storage layer 23, tunnel barrier 24, and reference layer 25.

In that case, in the memory cell array area MA, the test magnetic field TMF has lines of magnetic force perpendicular to the surface of the semiconductor substrate 21, that is, has lines of magnetic force extending in the direction of the lamination of the storage layer 23, tunnel barrier 24, and reference layer 25.

As shown in FIGS. 4 and 5, when the plurality of magnetoresistive elements MTJ are of the in-plane magnetization type, the test magnetic field generating portions 15 should preferably be disposed on right and left of the memory cell array area MA. For example, the test magnetic field generating portions 15 are disposed in a direction perpendicular to the direction of the lamination of the storage layer 23, tunnel barrier 24, and reference layer 25.

In that case, in the memory cell array area MA, the test magnetic field TMF has lines of magnetic force parallel with the surface of the semiconductor substrate 21, that is, has lines of magnetic force extending in the direction perpendicular to the direction of the lamination of the storage layer 23, tunnel barrier 24, and reference layer 25.

Note that, when the test magnetic field generating portion 15 is a permanent magnet, the test magnetic field generating portion 15 should contains, for example, a Co—Cr alloy, Sm—Co alloy, Co—Pt alloy, Nd—Fe alloy, Mn—Al alloy, Al—Ni—Co alloy, Ba ferrite oxide, and Co ferrite oxide.

Furthermore, since the test magnetic field generating portion 15 is for accelerating the test for the magnetic memory 13, the strength of the test magnetic field TMF generated from the test magnetic field portion 15 should preferably be set within a range of 0 to 2000 Oe.

The magnetic shield portion 12 functions as a closed magnetic circuit of the test magnetic field TMF generated from the test magnetic field generating portion 15. The magnetic shield portion 12 should preferably contain, for example, Ni, Fe, Co, Ni—Fe alloy, Fe—Co alloy, and $Fe_2O_4$ including Ni, Mn, or Zn. The magnetic shield portion 12 should preferably be a housing whose thickness is larger than 100 nm but smaller than 100 μm for securely shielding the external magnetic field.

[Examples of the Magnetic Memory, Interface Portion, and Test Magnetic Field Generating Portion]

FIGS. 6 and 7 show a first example of the magnetic memory, interface portion, and test magnetic field generating portion.

In this example, the magnetic memory 13 is, for example, a semiconductor substrate including a plurality of chip areas C, in other words, a wafer. The interface portion 14 is a probe card including a plurality of probes 16. The plurality of probes 16 correspond to the plurality of chip areas C.

Furthermore, the interface portion 14 includes a semiconductor substrate (wafer) used as, for example, a holder to hold the plurality of probes 16. The interface portion 14 is driven two- or three-dimensionally by the controller 11. While the magnetic memory 13 is being tested by the test signals from the controller 11, the plurality of probes 16 of the interface portion 14 are in contact with electrodes of the magnetic memory 13.

In the example shown in FIG. 6, the test magnetic field generating portion 15 is disposed adjacent to the interface portion 14. Here, the test magnetic field generating portion 15 may be combined with the interface portion 14 or may be separated from the interface portion 14.

In the example shown in FIG. 7, the test magnetic field generating portion 15 is disposed adjacent to the magnetic memory 13. The test magnetic field generating portion 15 may function as a holder to maintain the magnetic memory 13.

Note that the size of the semiconductor substrate (wafer) as the magnetic memory 13 should preferably be smaller than that of the test magnetic field generating portion 15 for evenly applying the test magnetic field to the magnetic memory 13.

Figure 8:
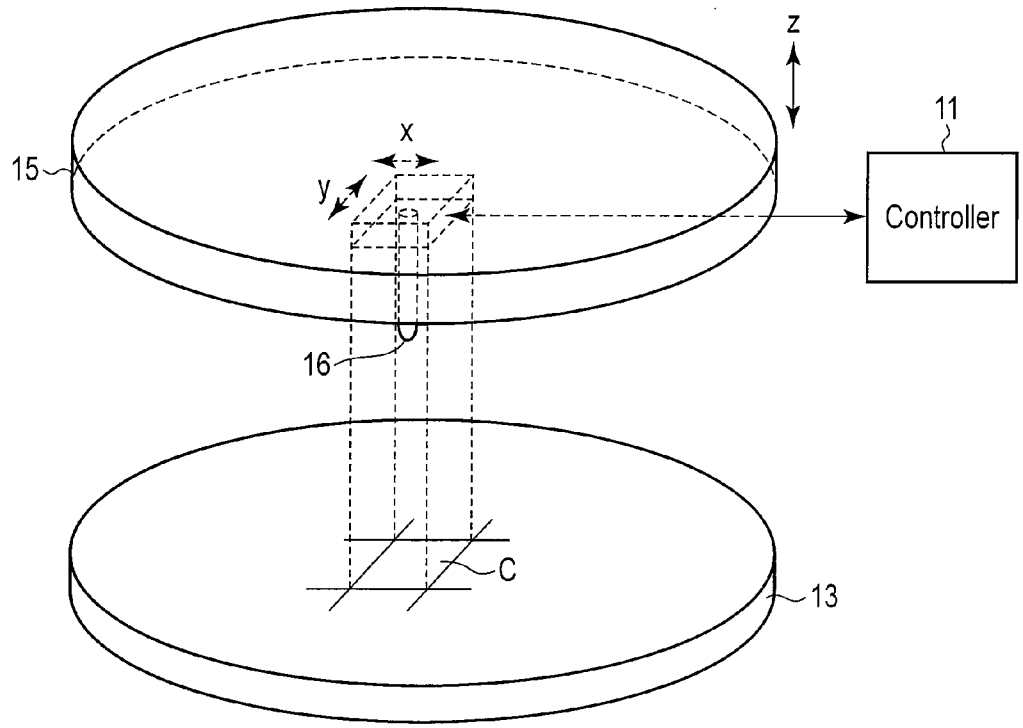
Figure 9:
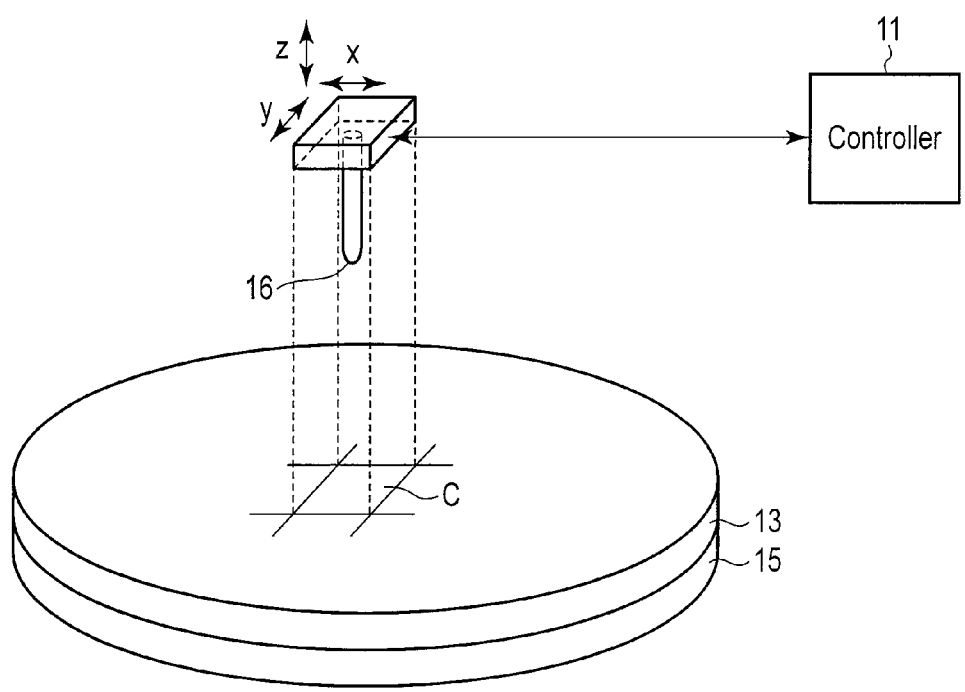

FIGS. 8 and 9 show a second example of the magnetic memory, interface portion, and test magnetic field generating portion.

In this example, the structure of the interface portion 14 is different from that of the first example (FIGS. 6 and 7), but the other points are the same as those of the first example.

The interface portion 14 is a probe card including a single probe 16. A chip area C in the magnetic memory (wafer) 13 is connected to the controller 11 via the interface portion 14.

The interface portion 14 includes a semiconductor substrate used as, for example, a holder to hold the single probe 16. The interface portion 14 is driven two- or three-dimensionally by the controller 11.

In the example shown in FIG. 8, the test magnetic field generating portion 15 is disposed adjacent to the interface portion 14. The test magnetic field portion 15 may be combined with the interface portion 14 or may be separated from the interface portion 14.

In the example shown in FIG. 9, the test magnetic field generating portion 15 is disposed adjacent to the magnetic memory 13. The test magnetic field generating portion 15 may function as a holder to maintain the magnetic memory 13.

Note that the size of the magnetic memory 13 (wafer) should preferably be smaller than that of the test magnetic field generating portion 15 for evenly applying the test magnetic field to the magnetic memory 13.

Figure 10:
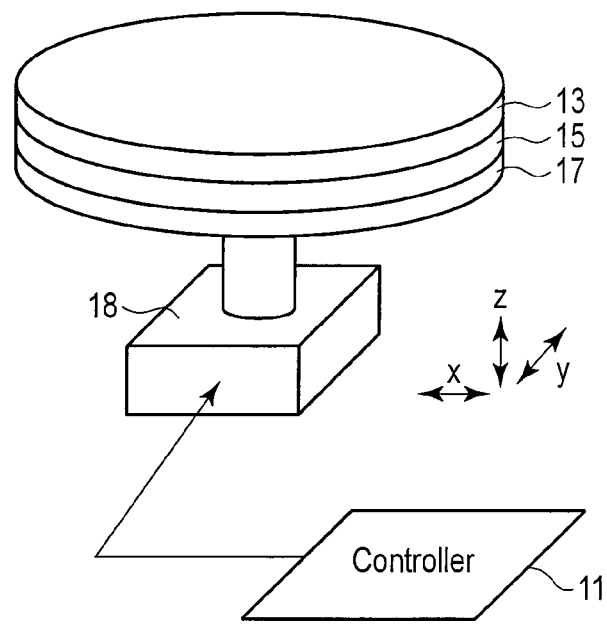
Figure 11:
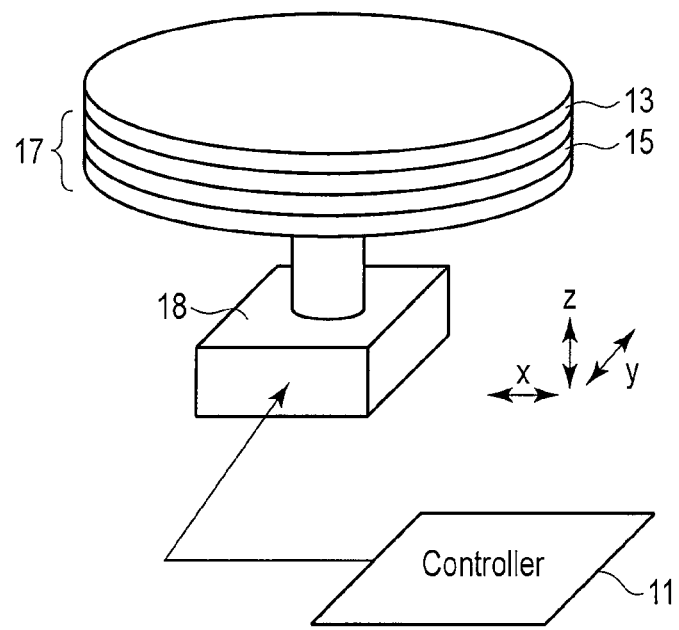

FIGS. 10 and 11 show a third example of the magnetic memory, interface portion, and test magnetic field generating portion.

This example shows that the test magnetic field generating portion 15 is disposed adjacent to the magnetic memory 13.

The semiconductor substrate (wafer) as the magnetic memory 13 is mounted on a wafer holder 17. The wafer holder 17 is connected to a driving device 18. The driving device 18 drives the wafer holder 17 based on an instruction from the controller 11. That is, the wafer holder 17 is driven two- or three-dimensionally by the driving device 18.

In the example shown in FIG. 10, the test magnetic field generating portion 15 is disposed on the wafer holder 17. That is, the test magnetic field generating portion 15 is inserted between the magnetic memory 13 and the wafer holder 17. Furthermore, in the example shown in FIG. 11, the test magnetic field generating portion 15 is disposed in the wafer holder 17. That is, the test magnetic field generating portion 15 is integrated in the wafer holder 17.

Note that the size of the semiconductor substrate (wafer) as the magnetic memory 13 should preferably be smaller than that of the test magnetic field generating portion 15 for evenly applying the test magnetic field to the magnetic memory 13.

FIG. 12 shows a fourth example of the magnetic memory, interface portion, and test magnetic field generating portion.

This example shows a modified example of the second example (FIG. 8).

In the example shown in FIG. 8, the test magnetic field generating portion 15 is in the same shape as that of the semiconductor substrate (wafer) as the magnetic memory 13. That is, regardless of the chip area C as a test target, the test magnetic field from the test magnetic field generating portion 15 is applied evenly to the whole semiconductor substrate (wafer) as the magnetic memory 13.

In contrast to this, in the example shown in FIG. 12, the test magnetic field generating portion 15 is in the same shape as that of the chip area C in the semiconductor substrate (wafer) as the magnetic memory 13. That is, the test magnetic field from the test magnetic field generating portion 15 is applied evenly to the chip area C in the semiconductor substrate (wafer) as the magnetic memory 13.

Note that the size of the test magnetic field generating portion 15 should preferably be larger than that of the chip area C for evenly applying the test magnetic field to chip area C.

FIGS. 13 to 15 show a fifth example of the magnetic memory, interface portion, and test magnetic field generating portion.

This example has its feature in forming the magnetic memory 13 as a chip.

The test method of this example is applicable to the test performed in the wafer condition as shown in FIGS. 6 to 12, and is also applicable to the test performed in the chip condition (including a packaged condition) as shown in FIGS. 13 to 15.

FIG. 13 shows an example of a test of a single magnetic memory (chip) 13 using an interface portion 14 having a single probe 16. FIGS. 14 and 15 show an example of a test of four magnetic memories (chips) 13 using an interface portion 14 having a plurality of probes (for example, four probes).

In the example shown in FIG. 14, a single common test magnetic field generating portion 15 is provided with the four magnetic memories 13. Meanwhile, in the example shown in FIG. 15, four test magnetic field generating portions 15 are provided with the four magnetic memories 13.

Note that the test magnetic field generating portions 15 are provided adjacent to the interface portion 14 in these examples, but may be disposed adjacent to the magnetic memory (chip) 13 instead. Furthermore, the test magnetic field generating portion 15 may be combined with the interface portion 14 or may be separated from the interface portion 14.

Furthermore, the size of the test magnetic field generating portion 15 should preferably be larger than that of the magnetic memory 13 (in the example of FIG. 15, it is the total size of the four magnetic memories 13) for evenly applying the test magnetic field to the magnetic memory (chip) 13.

Note that, when performing the retention test, read disturb test, and WER test in the first to fifth examples, the test magnetic field generating portion 15 only needs to generate a test magnetic field whose magnetic field strength is 0 or more and 2000 Oe or less, more specifically, within a range of 1000 to 2000 Oe. If the permanent magnet is used, such magnetic field strength can be obtained without any problem at a range of 1 to 2 mm from the magnet.

For example, a neodymium magnet of 10 mm×10 mm×10 mm can generate a magnetic field whose strength is approximately 1800 Oe at 1 mm from the magnet itself. A permanent magnet of this size can be incorporated in the test magnetic field generating portion 15 inside the interface portion (probe card) 14 or the wafer holder 17.

Furthermore, the test magnetic field generating portion 15 should preferably reverse the direction of the test magnetic field. That is, the test magnetic field generating portion 15 should preferably alter the direction of the test magnetic field in accordance with test types and magnetization conditions of the magnetoresistive element (parallel/anti-parallel conditions). Such a structure can be easily achievable when an electromagnet is used. As a matter of course, even when a permanent magnet is used, the direction of the test magnetic field can be altered with a mechanism to physically reverse the polarity of the magnet.

[Memory Cell Array Area of Magnetic Memory]

FIGS. 16 to 20 show an example of memory cell array area of a magnetic memory.

Figure 16:
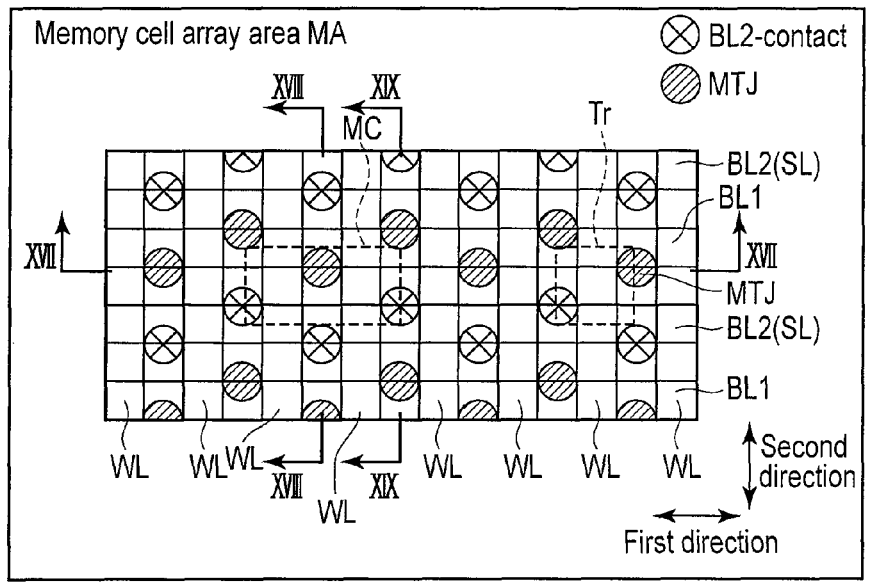
FIG. 16 is a plane view showing an example of a memory cell array area.
Figure 17:
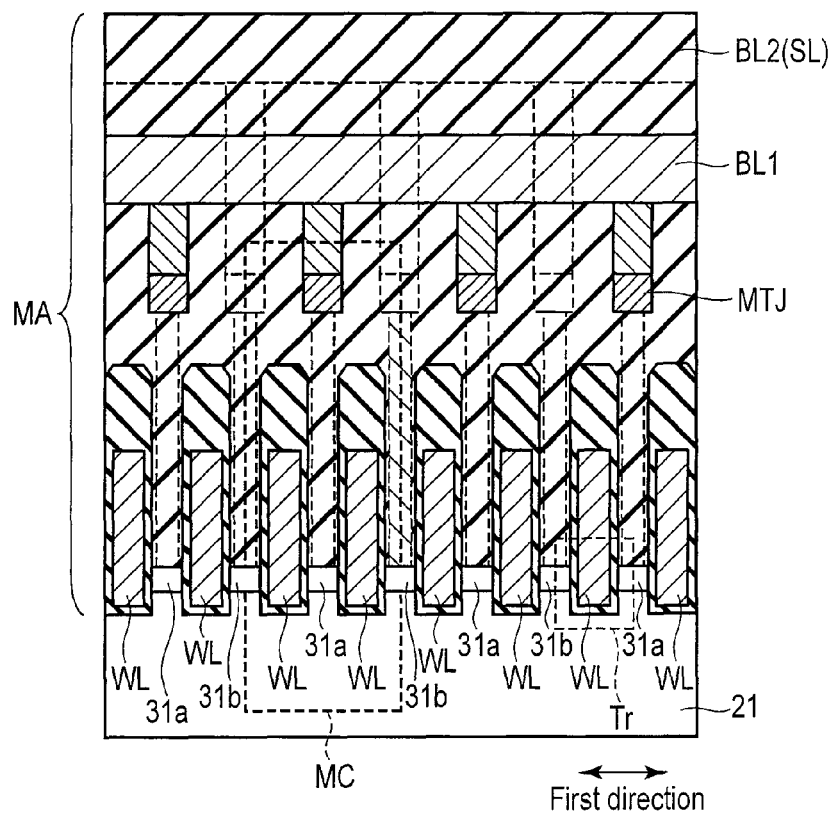
FIG. 17 is a cross-sectional view taken along line XVII-XVII in FIG. 16.

FIG. 16 is a plane view of the memory cell array area, FIG. 17 is a cross-sectional view taken along line XVII-XVII in FIG. 16, FIG. 18 is a cross-sectional view taken along line XVIII-XVIII in FIG. 16, and FIG. 19 is a cross-sectional view taken along line XIX-XIX in FIG. 16. FIG. 20 is an equivalent circuit of the memory cell array area shown in FIGS. 16 to 19.

Here, explained is a case where one memory cell MC in the memory cell array area MA includes two selection transistors Tr and one magnetoresistive element MTJ, in other words, a 2Tr-1MTJ memory cell. However, this does not mean that the test methods are applied to this type alone. That is, the test methods may be applied to other types of memory cell array area MA such as a 1Tr-1MTJ type and a cross-point type.

A plurality of memory cells MC are arranged in an array on the semiconductor substrate 21. Each memory cell MC includes two selection transistors Tr on the semiconductor substrate 21 and one magnetoresistive element MTJ connected to both of these two selection transistors Tr.

Each selection transistor Tr includes diffusion (source/drain) layers 31a and 31b in the semiconductor substrate 21 and a word line WL as a gate electrode on a channel between source/drain diffusion layers 31a and 31b. The word line WL extends in a second direction and is connected to a word line driver 41.

The amgnetoresistive effect element MTJ is disposed on diffusion layer 31a and is connected thereto. Furthermore, first bit line BL1 is disposed on the magnetoresistive element MTJ and is connected thereto. First bit line BL1 extends in a first direction and is connected to a bit line driver/sinker 42.

Second bit line BL2 is disposed on diffusion layer 31a and is connected thereto. In reading, second bit line BL2 functions as, for example, a source line SL connected to a sense amplifier. Second bit line BL2 extends in the first direction and is connected to a bit line driver/sinker and read circuit 43.

The layout of the memory cell array area MA described here is merely an example, and any arbitrary modification is adoptable. For example, when the memory cell array area MA is viewed from the above of the semiconductor substrate 11, diffusion layers 31a and 31b, magnetoresistive element MTJ, and bit line BL1 are shifted from one another in the second direction from a positional relationship standpoint; however, determination of shift or not shift, and determination of how far they are shifted are arbitrarily changeable.

Furthermore, in the present embodiment, first and second bit lines BL1 and BL2 are formed in different wiring layers but may be formed in the same wiring layer.

[Test Methods]

Now, test methods of a magnetic memory using the above-described tester are explained.

(1) Retention Test

Here, probability $P_R(t)$ that a data is reversed at t s after writing can be given by the equations (1) described in the above "Test variations" section.

From the equations, it can be seen that the energy barrier $\Delta E$ decreases with the increase of the external magnetic field $H_{ext}$ which is opposite to the magnetization direction of the storage layer. This means that the retention time is shorter when the external magnetic field $H_{ext}$ which is opposite to the magnetization direction of the storage layer is larger. Thus, the retention test can be accelerated by applying the external magnetic field $H_{ext}$ which is opposite to the magnetization direction of the storage layer during the test.

For example, when the test magnetic field generating portion is an electromagnet, the controller 11 shown in FIG. 1 performs the retention test taking at least the following consecutive steps.

First Step

Writing first data in a magnetoresistive element in a magnetic memory

Second Step

Applying a test magnetic field to the magnetoresistive element in the magnetic memory for a certain period of time Third Step Reading second data from the magnetoresistive element in the magnetic memory Fourth Step Comparing the first data to the second data and evaluating characteristics of the magnetoresistive element in the magnetic memory Specifically, the retention test is performed as in a flowchart shown in FIG. 21A.

Firstly, data initialization is performed to set the entire data in a plurality of magnetoresistive elements in the magnetic memory the same. For example, the entire data in the plurality of magnetoresistive elements are set to a low-resistance state (0 state) or a high-resistance state (1 state) by writing (step ST1).

Secondly, a test magnetic field is applied to the plurality of magnetoresistive elements in the magnetic memory for a certain period of time (step ST2).

If the magnetoresistive elements MTJ in the magnetic memory are, as shown in FIG. 24A, in the low-resistance state (parallel state), the test magnetic field TMF directed opposing to the magnetization direction of the storage layer 23 and reference layer 25 is applied to the magnetoresistive element MTJ.

Or, if the magnetoresistive elements MTJ in the magnetic memory are, as shown in FIG. 24B, in the high-resistance state (anti-parallel state), the test magnetic field TMF directed opposing to the magnetization direction of the storage layer 23 but in the same as that of the reference layer 25 is applied to the magnetoresistive elements MTJ.

Then, the data is read from the plurality of magnetoresistive elements in the magnetic memory (step ST3). Comparison between write data and read data is performed later to evaluate characteristics of the magnetoresistive elements in the magnetic memory (step ST4).

In this evaluation, for example, fail bits indicative of unmatched write and read data are detected to determine whether or not the number of fail bits is less than a predetermined value.

Lastly, if the number of fail bits is less than the predetermined value, it is determined that the magnetic memory currently being tested satisfies the requirements, and a redundancy replacement is performed to replace the fail bits with pass bits (step ST5).

In contrast, if the number of fail bits is greater than or equal to the predetermined value, it is determined that the magnetic memory currently being tested fails to satisfy the requirements and is a defective item.

Note that, in this example, the test magnetic field is applied to the magenetoresistive element in step ST2; however, timing of application is not limited to step ST2 and the test magnetic field may be applied to the magnetoresistive element in any other steps. For example, if the test magnetic field generating portion is a permanent magnet, the test magnetic field may be applied to the magnetoresistive element in all of steps ST1 to ST5 as shown in FIG. 21B.

Furthermore, in the flows shown in FIGS. 21A and 21B, steps ST4 and ST5 may be performed outside the magnetic shield portion, that is, in a state with no application of test magnetic field.

Figure 26:
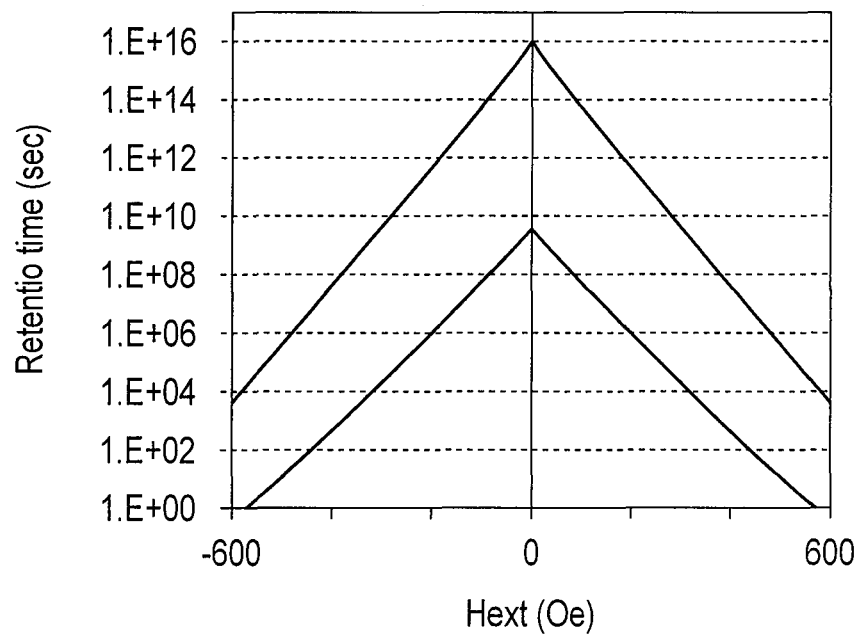
FIG. 26 is a view showing a relationship between the test magnetic field and retention time.

FIG. 26 shows a relationship between the test magnetic field and retention time.

In FIG. 26, the right side of 0 ($H_{ext}$) refers to a value given when a magnetization condition of the magnetoresistive element and the test magnetic field are in the state shown in FIG. 24A, and the left side of 0 ($H_{ext}$) refers to a value given when a magnetization condition of the magnetoresistive element and the test magnetic field are in the state shown in FIG. 24B.

The retention time (median) at the time when the test magnetic field (external magnetic field) $H_{ext}$ is zero is, as described in the above "Test variations" section, approximately $1 \times 10^{16}$ S and the retention time of the worst bit at the time when the test magnetic field $H_{ext}$ is zero is approximately $4 \times 10^9$ s. Here, the magnetic memory is a magnetic random access memory of 4 gigabits. Furthermore, the conditions used here are the room temperature, $\Delta E = 80$, and $H_k = 5000$ Oe. The worst bit is a value given when the variation of $\Delta E$ is 3%.

On the other hand, if the test magnetic field $H_{ext}$ is set to 500 Oe, for example, the retention time of the worst bit is approximately 9.7 s. This means that fail bits indicative of reversed data can be generated at the time when the read is performed approximately 9.7 s after the application of the test magnetic field to the magnetoresistive element.

Therefore, the retention test can be performed in line with the flows shown in FIGS. 21A and 21B if, for example, the certain period of time in step ST2 is set in a range of 10 to 30 s and the evaluation in step ST4 is performed to determine whether or not the number of fail bits is less than the predetermined value.

Concerning the flows shown in FIGS. 21A and 21B, the following point must be noted in generating the test magnetic field during steps ST2 to ST3.

That is, if a magnetic random access memory of 4 gigabits whose cycle time is 50 ns and which has a 128-bit burst length is subjected to the test, and given that a read cycle is 3 clocks, approximately 5 s are required to read the whole bits.

In that case, if the certain period of time in step ST2 is 10 s, a time to apply the test magnetic field for a bit read first is approximately 10 s whereas a time to apply the test magnetic field for a bit read last is approximately 15 s. That is, the time to apply the test magnetic field varies about 50% between the bit read first and the bit read last. This is inappropriate in performing a proper retention test.

Considering this point, in such a case, the test magnetic field is consecutively applied to the magnetoresistive element during step ST1 (initialization) and step ST3 (read) in the flows shown in FIGS. 21A and 21B.

This is because, if the order of write and the order of read are the same in the plurality of magnetoresistive elements to be tested, the time to apply the test magnetic field is substantially the same for the whole bits. Note that this is possible provided that the data write time in the magnetoresistive elements and the data read time in the magnetoresistive elements are substantially the same.

Specifically, in the flows shown in FIGS. 21A and 21B, if the time for initialization (write) in step ST1 is approximately 5 s, the certain period of time for step ST2 is approximately 10 s, and the time for read in step ST3 is approximately 5 s, the test magnetic field is applied to each bit for approximately 15 s substantially.

As can be understood from the above, the retention test can be performed within only 10 s or so according to this example.

(2) Read Disturb Test

The probability of occurrence of read disturb $P_{RD}$ can be given by the equation (2) described in the above "Test variations" section.

From the equation, it can be seen that $\Delta'$ decreases with the increase of the external magnetic field $H_{ext}$ which is opposite to the magnetization direction of the storage layer. This means that the reversal probability of the magnetization direction of the storage layer of the magnetoresistive element at the read time is higher when the external magnetic field $H_{ext}$ which is opposite to the magnetization direction of the storage layer is larger. Thus, the read disturb test can be accelerated by applying the external magnetic field $H_{ext}$ which is opposite to the magnetization direction of the storage layer during the test.

For example, when the test magnetic field generating portion is an electromagnet, the controller 11 shown in FIG. 1 performs the read disturb test taking at least the following consecutive steps.

First Step

Writing first data in a magnetoresistive element in a magnetic memory

Second Step

Reading second data from the magnetoresistive element in the magnetic memory while applying a test magnetic field to the magnetoresistive element in the magnetic memory Third Step Comparing the first data to the second data and evaluating characteristics of the magnetoresistive element in the magnetic memory Specifically, the read disturb test is performed as in a flowchart shown in FIG. 22A.

Firstly, data initialization is performed to set the entire data in a plurality of magnetoresistive elements in the magnetic memory the same. For example, the entire data in the plurality of magnetoresistive elements are set to a low-resistance state (0 state) or a high-resistance state (1 state) by writing (steps ST1 and ST2).

Secondly, the data is read from the plurality of magnetoresistive elements in the magnetic memory while applying the test magnetic field to the plurality of magnetoresistive elements in the magnetic memory (step ST3).

If the magnetoresistive elements MTJ in the magnetic memory are, as shown in FIG. 24A, in the low-resistance state (parallel state), the read is performed while the test magnetic field TMF directed opposing to the magnetization direction of the storage layer 23 and reference layer 25 is applied to the magnetoresistive element MTJ.

Or, if the magnetoresistive elements MTJ in the magnetic memory are, as shown in FIG. 24B, in the high-resistance state (anti-parallel state), the read is performed while the test magnetic field TMF directed opposing to the magnetization direction of the storage layer 23 but in the same as that of the reference layer 25 is applied to the magnetoresistive elements MTJ.

Then, fail bits indicative of unmatched write and read data are detected by comparing the write data to the read data (error check). The error check is repeated for Nmax times for each of the plurality of magnetoresistive elements in the magnetic memory. Here, Nmax is a natural number which is 2 or more (steps ST4 to ST6).

However, in the read disturb test, the error check (step ST4) may be performed only for a predetermined times Ncheck out of the loops of Nmax times. Here, Ncheck<Nmax. For example, even if Nmax is 100000 times, that is, the read (step ST3) is repeated 100000 times, the number of error check (step ST4) Ncheck may be merely 5 times.

In that case, the error check is performed at, for example, the 10th, 100th, 1000th, 10000th, and 100000th loop count of the read (five times in total).

By reducing the number of error check Ncheck, the test time can be reduced as well.

Then, the evaluation of the magnetic memory is performed based on the number of fail bits in each of the plurality of magnetoresistive elements in the magnetic memory (step ST7).

This evaluation is performed to determine, for example, whether or not the number of fail bits is less than a predetermined value.

Lastly, the magnetoresistive elements showing the number of fail bits less than the predetermined value are determined to be pass bits, and in contrast, the magnetoresistive elements showing the number of fail bits greater than or equal to the predetermined value are determined to be fail bits. The fail bits determined here are replaced with pass bits by the redundancy replacement (step ST8).

Note that, in this example, the test magnetic field is applied to the magenetoresistive element in step ST3; however, timing of application is not limited to step ST3 and the test magnetic field may be applied to the magnetoresistive element in any other steps. For example, if the test magnetic field generating portion is a permanent magnet, the test magnetic field may be applied to the magnetoresistive element in all of steps ST1 to ST8 as shown in FIG. 22B.

Figure 22B:
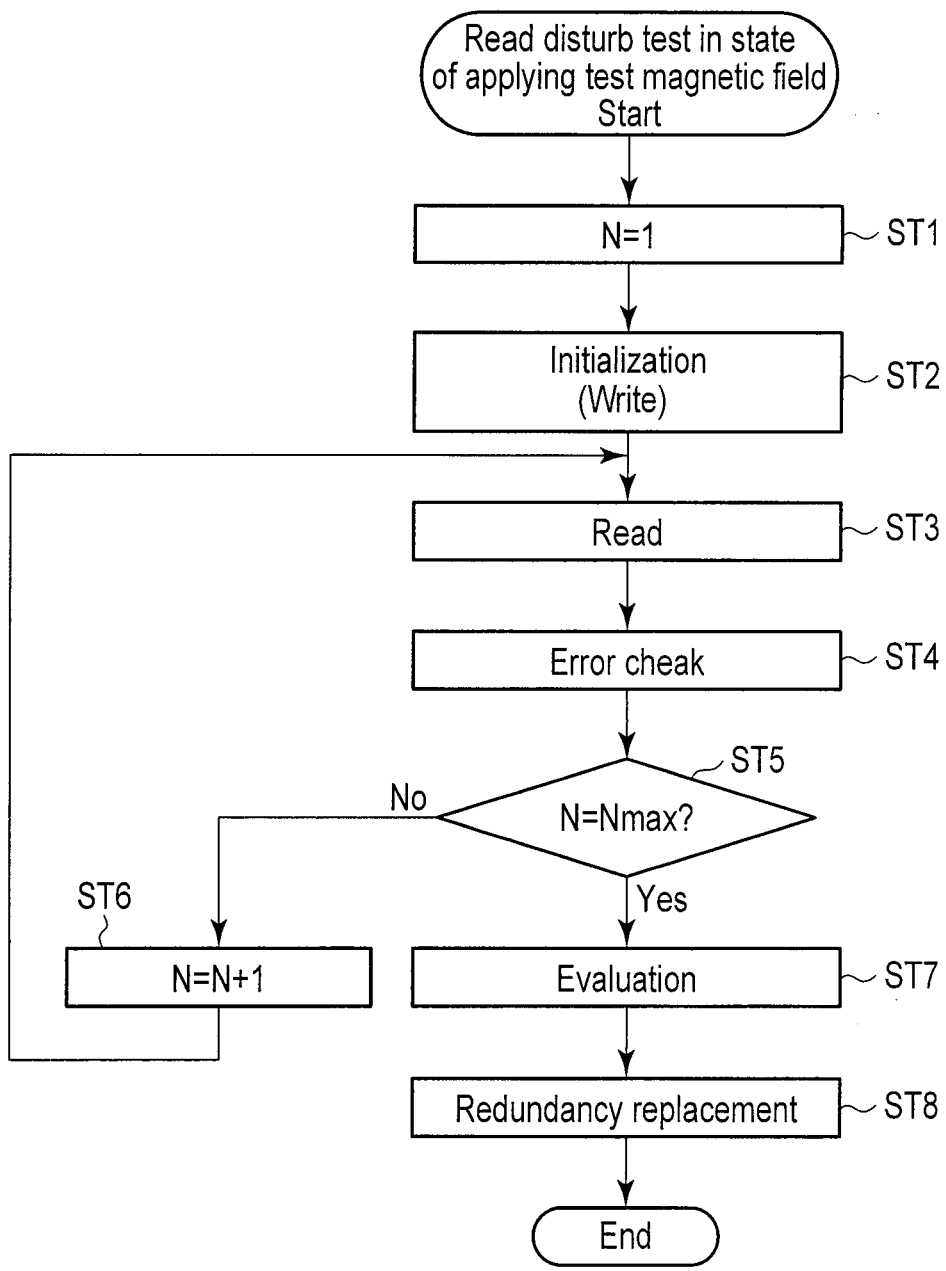

Furthermore, in the flows shown in FIGS. 22A and 22B, steps ST7 and ST8 may be performed outside the magnetic shield portion, that is, in a state with no application of test magnetic field.

Figure 27:
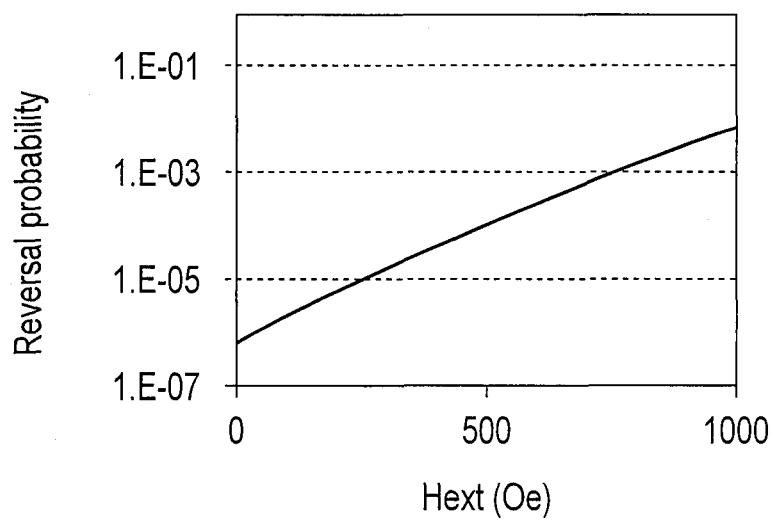
FIG. 27 is a view showing a relationship between the test magnetic field and reversal probability.

FIG. 27 shows a relationship between the test magnetic field and reversal probability.

In FIG. 27, the test magnetic field (external magnetic field) $H_{ext}$ is applied to a direction opposite to the magnetization direction of the storage layer of the magnetoresistive element. Furthermore, the reversal probability here refers to that of the worst bit.

The reversal probability (probability of occurrence of read disturb $P_{RD}$) at the time when the test magnetic field $H_{ext}$ is zero is, as described in the above "Test variations" section, approximately $0.8 \times 10^{-6}$. Here, the magnetic memory is a magnetic random access memory of 4 gigabits. Furthermore, the conditions used here are the room temperature, $\Delta'=80$, $L_{read}=10$ µA, $t_{read}$ read=10 ns, $\tau_0=10^{-9}$ s, and $I_{c0}=25.6$ µA. The worst bit is a value given when the variation of $\Delta'$ is 10%.

From FIG. 27, it can be seen that the reversal probability (probability of occurrence of read disturb $P_{RD}$) at the time when the test magnetic field $H_{ext}$ is 1000 Oe is approximately $0.7 \times 10^{-2}$. This value is about four digits higher than the value given at the time when the external magnetic field $H_{ext}$ is zero (which is approximately $0.8 \times 10^{-6}$).

The reversal probability at the time when the test magnetic field Hext is 1000 Oe (which is approximately $0.7 \times 10^{-2}$) means that the determination of fail bit may occur for at least 7 times when the read is repeated for 1000 times. That is, given that the read is performed under the same condition, if the determination of fail bit occurs for 8 times or more, the magnetoresistive element is determined to be a fail bit.

Here, the test time for the read repeated for 1000 times is, in a case where a magnetic random access memory of 4 gigabits whose cycle time is 50 ns and which has a 128-bit burst length is tested, approximately 12.1 s. As already described above, the test time when the test magnetic field $H_{ext}$ is zero is 231 hours. Comparing these times, the test time can be significantly reduced in this test method.

Note that the direction of read current is not specified here; however, in the STT-MRAM, the read current should preferably be supplied from the reference layer to the storage layer. This is because current used for magnetization reversal from the parallel state to the anti-parallel state is larger than that used for magnetization reversal from the anti-parallel state to the parallel state.

That is, by supplying the read current from the reference layer to the storage layer, the read current can be reduced enough as compared to write current flowing in the same direction (current for magnetization reversal from the parallel state to the anti-parallel state), and thereby, an erroneous writing which may occur in an ordinary reading can be prevented.

As can be understood from the above, the read disturb test can be performed within only 12 s or so according to this example.

(3) Write Error Rate (WER) Test

The write error rate $P_{WT}$ can be given by the equation (3) described in the above "Test variations" section.

From the equation, it can be seen that $\Delta''$ increases with the increase of the external magnetic field $H_{ext}$ which is in the same direction as the magnetization direction of the storage layer before writing, that is, which is opposite to the magnetization direction expected in the storage layer after the writing. This means that the reversal probability of the magnetization direction of the storage layer of the magnetoresistive element is higher when the external magnetic field $H_{ext}$ which is in the same direction as the magnetization direction of the storage layer before the writing is larger. Thus, the WER test can be accelerated by applying the external magnetic field $H_{ext}$ which is in the same direction as the magnetization direction of the storage layer before the writing during the test.

For example, when the test magnetic field generating portion is an electromagnet, the controller 11 shown in FIG. 1 performs the WER test taking at least the following consecutive steps.

First Step

Figure 23A:
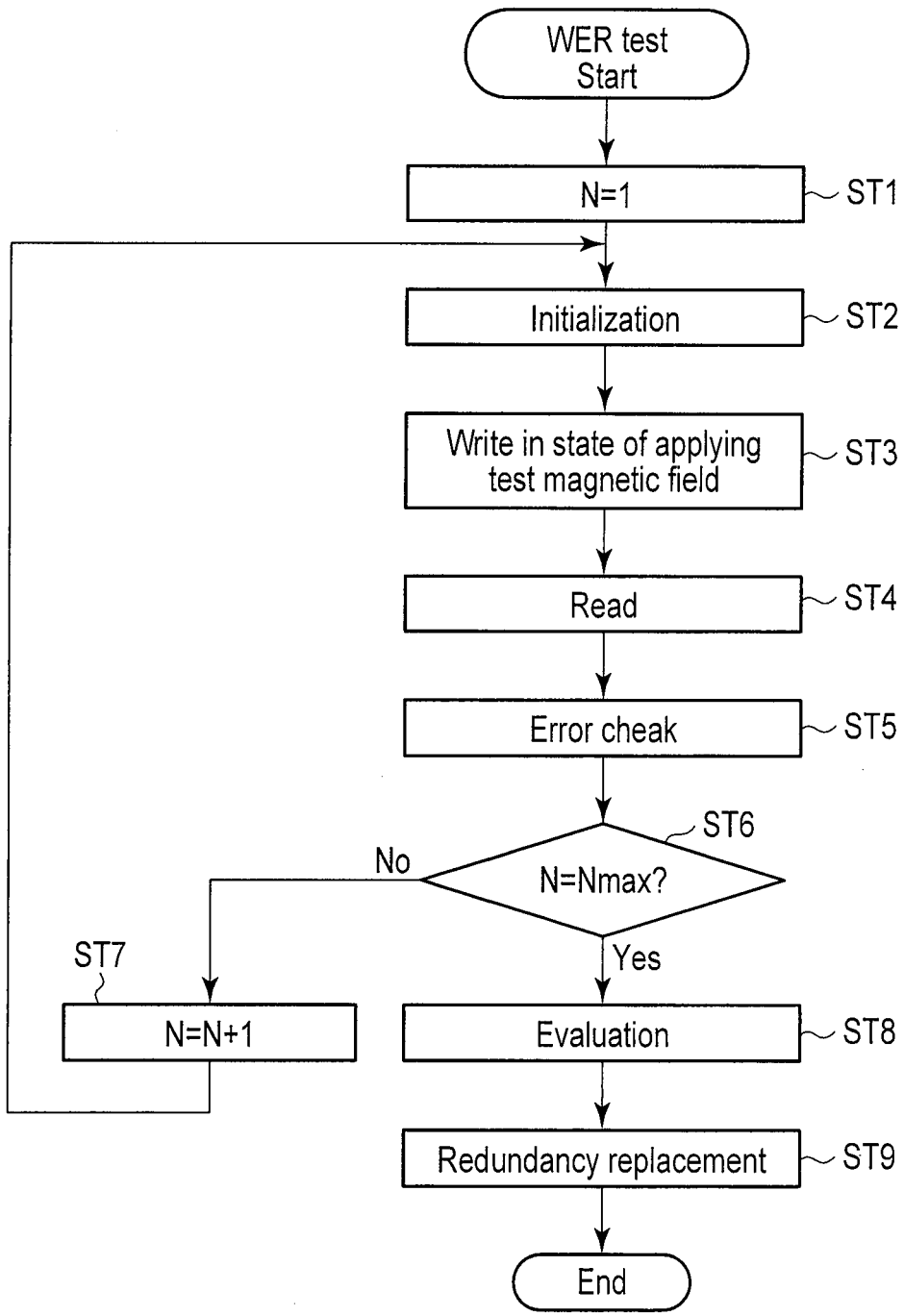
FIGS. 23A and 23B are flowcharts of WER test examples.

Writing first data in a magnetoresistive element in a magnetic memory while applying a test magnetic field to the magnetoresistive element in the magnetic memory Second Step Reading second data from the magnetoresistive element in the magnetic memory Third Step Comparing the first data to the second data and evaluating characteristics of the magnetoresistive element in the magnetic memory Specifically, the WER test is performed as in a flowchart shown in FIG. 23A.

Firstly, data initialization is performed to set the entire data in a plurality of magnetoresistive elements in the magnetic memory the same. For example, the entire data in the plurality of magnetoresistive elements are set to a low-resistance state (0 state) or a high-resistance state (1 state) by writing (steps ST1 and ST2).

Secondly, the entire data in the plurality of magnetoresistive elements in the magnetic memory are reversed by writing. This writing is performed while the test magnetic field which is in the same direction as the magnetization direction of the storage layer before the writing, that is, the test magnetic field which is opposite to the magnetization direction expected in the storage layer after the writing is applied to all of the plurality of magnetoresistive elements in the magnetic memory (step ST3).

For example, as shown in FIG. 25A, when the magnetization of the magnetoresistive element MTJ in the magnetic memory is reversed from the parallel state to the anti-parallel state, the test magnetic field TMF which is in the same direction as the magnetization direction of the parallel state storage layer before the writing is applied to the magnetoresistive element MTJ during the writing.

Furthermore, as shown in FIG. 25B, when the magnetization of the magnetoresistive element MTJ in the magnetic memory is reversed from the anti-parallel state to the parallel state, the test magnetic field TMF which is in the same direction as the magnetization direction of the anti-parallel state storage layer before the writing is applied to the magnetoresistive element MTJ during the writing.

Then, the data is read from the plurality of magnetoresistive elements in the magnetic memory (step ST4). Furthermore, fail bits indicative of unmatched write and read data are detected by comparing the write data to the read data (error check). The error check is repeated for Nmax times for each of the plurality of magnetoresistive elements in the magnetic memory.

Here, Nmax is a natural number which is 2 or more (steps ST5 to ST7).

Then, the evaluation of the magnetic memory is performed based on the number of fail bits in each of the plurality of magnetoresistive elements in the magnetic memory (step ST8).

This evaluation is performed to determine, for example, whether or not the number of fail bits is less than a predetermined value.

Lastly, the magnetoresistive elements showing the number of fail bits less than the predetermined value are determined to be pass bits, and in contrast, the magnetoresistive elements showing the number of fail bits greater than or equal to the predetermined value are determined to be fail bits. The fail bits determined here are replaced with pass bits by the redundancy replacement (step ST9).

Note that, in this example, the test magnetic field is applied to the magenetoresistive element in step ST3; however, timing of application is not limited to step ST3 and the test magnetic field may be applied to the magnetoresistive element in any other steps. For example, if the test magnetic field generating portion is a permanent magnet, the test magnetic field may be applied to the magnetoresistive element in all of steps ST1 to ST9 as shown in FIG. 23B.

Figure 23B:
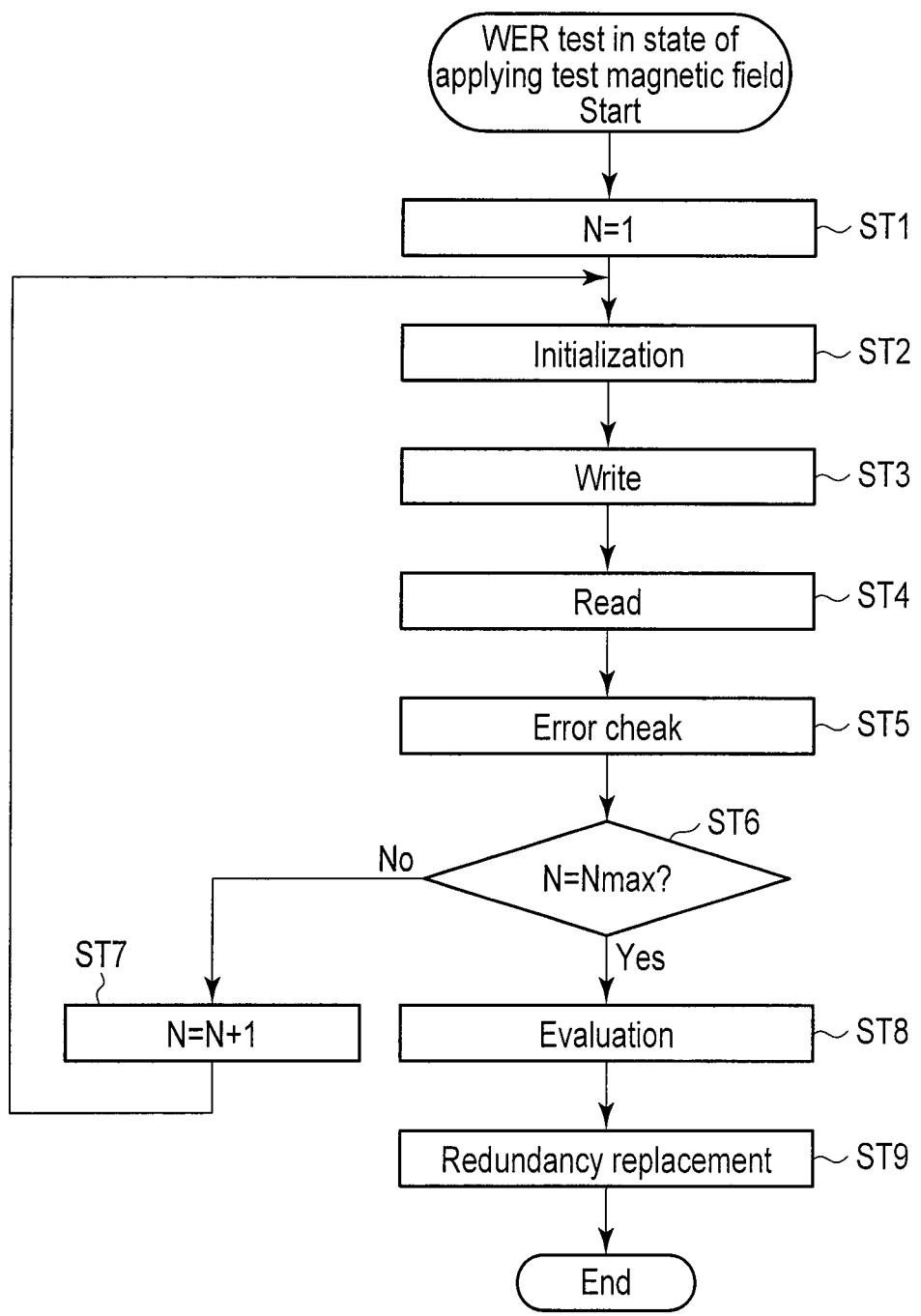

Furthermore, in the flows shown in FIGS. 23A and 23B, steps ST8 and ST9 may be performed outside the magnetic shield portion, that is, in a state with no application of test magnetic field.

FIG. 28 shows a relationship between the test magnetic field and non-reversal probability.

In FIG. 28, the test magnetic field (external magnetic field) $H_{ext}$ is applied to the same direction as the magnetization direction of the storage layer of the magnetoresistive element before writing. Furthermore, the non-reversal probability indicative of no performance of writing (magnetization reversal) here refers to that of the worst bit.

The non-reversal probability (probability of occurrence of write error $P_{WT}$) at the time when the test magnetic field $H_{ext}$ is zero is, as described in the above "Test variations" section, approximately $2.8 \times 10^{-11}$. Here, the magnetic memory is a magnetic random access memory of 4 gigabits. Furthermore, the conditions used here are the room temperature, $\Delta''=90$, $L_{write}=30$ μA, $t_{WT}$ read=30 ns, $\tau_0=10^{-9}$ s, and $I_{c0}=25.6$ μA. The worst bit is a value given when the variation of $\Delta''$ is 10%.

From FIG. 28, it can be seen that the non-reversal probability $P_{WT}$ at the time when the test magnetic field $H_{ext}$ is 2000 Oe is approximately $5 \times 10^{-8}$. This value is about three digits higher than the value given at the time when the external magnetic field $H_{ext}$ is zero (which is approximately $2.8 \times 10^{-11}$).

The non-reversal probability at the time when the test magnetic field Hext is 2000 Oe (approximately $5 \times 10^{-8}$) means that fail bits indicative of no performance of writing (magnetization reversal) can be detected when the writing is repeated.

Here, the test time for the write/read repeated for 1000 times is, in a case where a magnetic random access memory of 4 gigabits whose cycle time is 50 ns and which has a 128-bit burst length is tested, approximately 24.2 (12.1×2) s. As already described above, the test time when the test magnetic field $H_{ext}$ is zero is very long. Comparing these times, the test time can be significantly reduced in this test method.

As can be understood from the above, the WER test can be performed within only 24 s or so according to this example.

[Others]

The above test methods are presented with the assumption that they are all performed at the room temperature.

Figure 29:
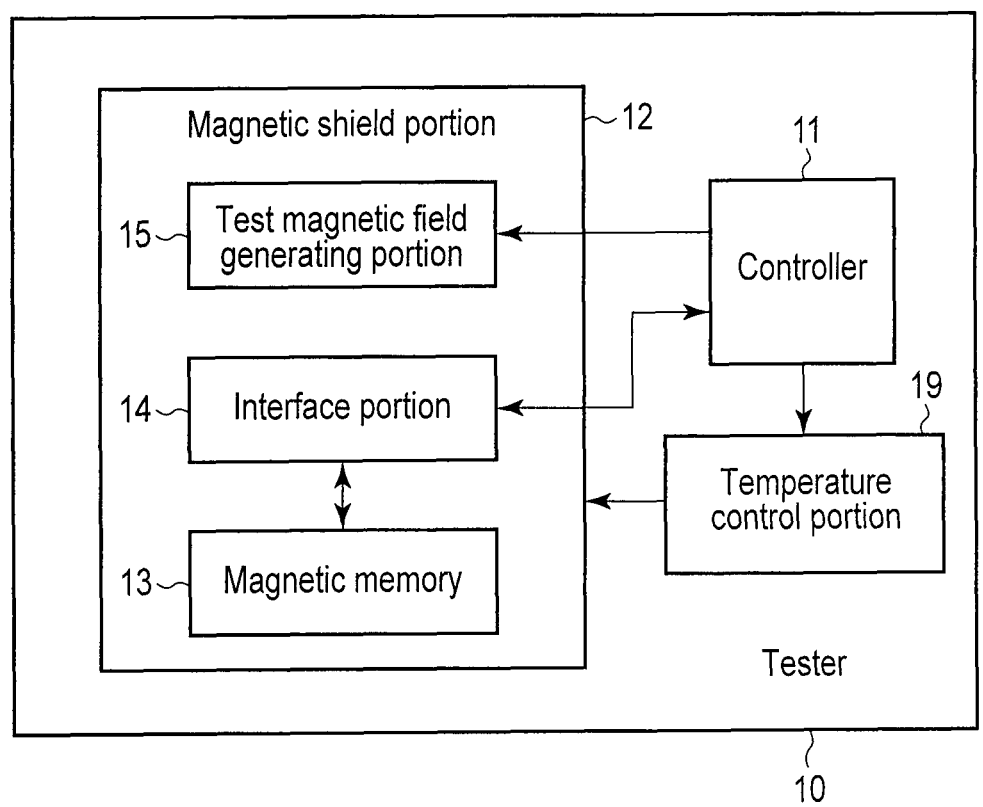
FIG. 29 is a block diagram showing an example of modification of the tester of the magnetic memory.

However, the above test methods may be performed at the temperature above the room temperature. That is, as shown in FIG. 29, a temperature control portion 19 may be added to the tester 10 to control the temperature inside the magnetic shield portion 12. In that case, the test can be further accelerated by the temperature in addition to the test magnetic field, and thus, the test time can be reduced more effectively.

For example, if the temperature inside the magnetic shield portion 12 (test temperature) is set to 85° C., ΔE is reduced by approximately 20% by the thermal disturbance. Furthermore, if the temperature inside the magnetic shield portion 12 is set to 150° C., ΔE is reduced by approximately 40% by thermal disturbance. Thereby, the retention time can be reduced, the probability of occurrence of read disturb can be increased, and the write error rate can be increased.

As can be understood from the above, when the test magnetic field and test temperature are used in combination, the test time can be further reduced as compared to a case where the test magnetic field alone is used for the reduction of test time.

Furthermore, in the above test methods, the initialization (writing) may be performed by, for example, writing by magnetic field instead of conventional writing by write current.

Here, if a permanent magnet is used for both the writing by magnetic field and the generation of test magnetic field, a mechanism to switch the permanent magnet between the writing and the generation may be provided with the test magnetic field generating portion 15. If an electromagnet is used for both the writing by magnetic field and the generation of test magnetic field, the writing and the generation can be performed by the test magnetic field generating portion 15 by controlling the strength of the magnetic field generated by the electromagnet.

Moreover, such a structure that a permanent magnet is used for generating the test magnetic field and an electromagnet is used for writing by magnetic field (initialization) may be employed.

Note that the writing by magnetic field has an advantage that the entire bits are initialized at the same time. That is, the time for the initialization can be reduced.

The above test methods can be applied to both a wafer level test and a chip level test.

CONCLUSION

As described above, tests to verify functions of a magnetic memory can be performed in a short time according to the present embodiments. Furthermore, fail bits detected by the tests can be replaced with pass bits by a redundancy technique, and thus, magnetic memories can be manufactured at high yield rates. Therefore, magnetic memories of high quality can be commercialized.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A tester comprising:
a controller which generates a test signal for testing a magnetic memory having a magnetoresistive element;
an interface portion which functions as an interface between the controller and the magnetic memory; and
a magnetic field generating portion which applies a test magnetic field to the magnetoresistive element,
wherein the controller is configured to:
execute a first step in which a first data is written to the magnetoresistive element;
execute a second step in which the test magnetic field is applied to the magnetoresistive element for a fixed period of time, after executing the first step;
execute a third step in which a second data is read from the magnetoresistive element, after executing the second step; and
execute a fourth step in which a characteristic of the magnetoresistive element is evaluated by comparing the first and second data, after executing the third step.

2. The tester of claim 1, wherein the test magnetic field is directed in a direction of $\theta$ to a magnetization direction of the magnetoresistive element, where $0° \leq \theta \leq 90°$.

3. The tester of claim 1, wherein the test magnetic field has an intensity lower than an intensity of a reversal magnetic field which is reversed to a magnetization direction of a storage layer of the magnetoresistive element.

4. The tester of claim 1, wherein the magnetoresistive element is provided on a semiconductor substrate, and has a magnetization direction which is perpendicular to a surface of the semiconductor substrate.

5. The tester of claim 1, wherein the magnetic field generating portion comprises a permanent magnet or an electromagnet controlled by the controller.

6. The tester of claim 1, wherein the interface portion includes a probe which contacts with an electrode of the magnetic memory while the magnetic memory is tested by the test signal, and a holder having a first surface and a second surface, the holder holding the probe in the first surface.

7. The tester of claim 1, further comprising:
a magnetic shield portion having a space which is shielded from an external magnetic field,
wherein the magnetic memory, the interface portion, and the magnetic field generating portion are provided in the space.

8. A tester comprising:
a controller which generates a test signal for testing a magnetic memory having a magnetoresistive element;
an interface portion which functions as an interface between the controller and the magnetic memory; and
a magnetic field generating portion which applies a test magnetic field to the magnetoresistive element,
wherein the controller is configured to:
execute a first step in which a first data is written to the magnetoresistive element;
execute a second step in which a second data is read from the magnetoresistive element in a state of applying the test magnetic field to the magnetoresistive element, after executing the first step; and
execute a third step in which a characteristic of the magnetoresistive element is evaluated by comparing the first and second data, after executing the second step.

9. The tester of claim 8, wherein the test magnetic field is directed in a direction of $\theta$ to a magnetization direction of the magnetoresistive element, where $0° \leq \theta \leq 90°$.

10. The tester of claim 8, wherein the test magnetic field has an intensity lower than an intensity of a reversal magnetic field which is reversed to a magnetization direction of a storage layer of the magnetoresistive element.

11. The tester of claim 8, wherein the magnetoresistive element is provided on a semiconductor substrate, and has a magnetization direction which is perpendicular to a surface of the semiconductor substrate.

12. The tester of claim 8, wherein the magnetic field generating portion comprises a permanent magnet or an electromagnet controlled by the controller.

13. The tester of claim 8, wherein the interface portion includes a probe which contacts with an electrode of the magnetic memory while the magnetic memory is tested by the test signal, and a holder having a first surface and a second surface, the holder holding the probe in the first surface.

14. The tester of claim 8, further comprising:
a magnetic shield portion having a space which is shielded from an external magnetic field,
wherein the magnetic memory, the interface portion, and the magnetic field generating portion are provided in the space.

15. A tester comprising:
a controller which generates a test signal for testing a magnetic memory having a magnetoresistive element;
an interface portion which functions as an interface between the controller and the magnetic memory; and
a magnetic field generating portion which applies a test magnetic field to the magnetoresistive element,
wherein the controller is configured to:
execute a first step in which a first data is written to the magnetoresistive element in a state of applying the test magnetic field to the magnetoresistive element;
execute a second step in which a second data is read from the magnetoresistive element, after executing the first step; and
execute a third step in which a characteristic of the magnetoresistive element is evaluated by comparing the first and second data, after executing the second step.

16. The tester of claim 15, wherein the test magnetic field is directed in a direction of θ to a magnetization direction of the magnetoresistive element, where 0°<θ<90°.

17. The tester of claim 15, wherein the test magnetic field has an intensity lower than an intensity of a reversal magnetic field which is reversed to a magnetization direction of a storage layer of the magnetoresistive element.

18. The tester of claim 15, wherein the magnetoresistive element is provided on a semiconductor substrate, and has a magnetization direction which is perpendicular to a surface of the semiconductor substrate.

19. The tester of claim 15, wherein the magnetic field generating portion comprises a permanent magnet or an electromagnet controlled by the controller.

20. The tester of claim 15, wherein the interface portion includes a probe which contacts with an electrode of the magnetic memory while the magnetic memory is tested by the test signal, and a holder having a first surface and a second surface, the holder holding the probe in the first surface.

21. The tester of claim 15, further comprising:
a magnetic shield portion having a space which is shielded from an external magnetic field,
wherein the magnetic memory, the interface portion, and the magnetic field generating portion are provided in the space.

* * * * *